United States Patent [19]

Satoh et al.

[11] Patent Number: 5,709,811
[45] Date of Patent: Jan. 20, 1998

[54] MAGNETIC MATERIAL FOR MICROWAVE AND HIGH-FREQUENCY CIRCUIT COMPONENT USING THE SAME

[75] Inventors: Toshifumi Satoh, Nara; Hirotaka Furukawa, Osaka; Osamu Inoue, Osaka; Takayuki Takeuchi, Osaka; Kenji Iijima, Kyoto; Koichi Kugimiya, Oska, all of Japan

[73] Assignee: Matsushita Electric Industrial Co., Ltd., Osaka, Japan

[21] Appl. No.: 629,101

[22] Filed: Apr. 8, 1996

[30] Foreign Application Priority Data

| Apr. 11, 1995 | [JP] | Japan | 7-085709 |
| Jul. 27, 1995 | [JP] | Japan | 7-191678 |
| Oct. 6, 1995 | [JP] | Japan | 7-259764 |
| Dec. 19, 1995 | [JP] | Japan | 7-330012 |
| Dec. 20, 1995 | [JP] | Japan | 7-331435 |

[51] Int. Cl.⁶ ..................... C04B 33/40
[52] U.S. Cl. ............. 252/62.57; 333/1.1; 331/36 R; 331/382; 331/181
[58] Field of Search .......... 252/62.57; 333/1.1; 331/36 R, 38 L, 181; 428/694 GT, 693

[56] References Cited

U.S. PATENT DOCUMENTS

| 3,281,363 | 10/1966 | Geller et al. | 252/62.57 |
| 3,654,162 | 4/1972 | Buhrer | 252/62.57 |
| 4,968,954 | 11/1990 | Ryuo et al. | 252/62.57 |
| 5,146,361 | 9/1992 | Licht | 252/62.57 |
| 5,198,923 | 3/1993 | Watanabe et al. | 252/62.57 |
| 5,501,913 | 3/1996 | Shimokawa et al. | 252/62.57 |

FOREIGN PATENT DOCUMENTS

| 0 214 026 | 3/1987 | European Pat. Off. |  |
| 0 428 155 | 5/1991 | European Pat. Off. |  |
| 428155 | 5/1991 | European Pat. Off. |  |
| 0 599 201 | 6/1994 | European Pat. Off. |  |
| 2-164723 | 6/1990 | Japan | 252/62.57 |
| 3-8725 | 1/1991 | Japan |  |
| 3-159915 | 7/1991 | Japan |  |
| 3-223199 | 10/1991 | Japan | 252/62.57 |
| 5-13225 | 1/1993 | Japan | 252/62.57 |
| 5-13229 | 1/1993 | Japan | 252/62.57 |
| 7-111406 | 4/1995 | Japan |  |

OTHER PUBLICATIONS

Patent Abstract of Japan, vol. 014, No. 571 re Japanese 2-248398 dated Oct. 4, 1990.

Matsumoto, et al., "Preparation of Dismuth-Substituted Yttrium Iron Garnet Powders by the Citrate Gel Process", *Journal of Applied Physics*, vol. 69, No. 8, Apr. 15, 1991, pp. 5918-5920.

*Primary Examiner*—Melissa Bonner
*Attorney, Agent, or Firm*—Merchant, Gould, Smith, Edell, Welter & Schmidt, P.A.

[57] ABSTRACT

A magnetic material for microwave, comprising a phase having garnet structure, said phase comprising a component represented by Formula I $$(A_{3-a}Bi_a)B_xO_y \quad \text{Formula I}$$

where A represents a component comprising at least one element selected from yttrium (Y) and rare earth elements, B represents a component comprising Fe, a represents a number in the range of 0 to less than 2.00, x represents a number in the range of 4.76 to less than 5.00, and y represents a number satisfying an inequality $1.5(3+x) \leq y \leq 12$.

24 Claims, 4 Drawing Sheets

MAGNETIC MATERIAL FOR MICROWAVE AND HIGH-FREQUENCY CIRCUIT COMPONENT USING THE SAME

FIELD OF THE INVENTION

The invention relates to magnetic materials for microwave uses and circuit components for high frequency applications using the magnetic materials.

BACKGROUND OF THE INVENTION

In recent years, high speed and high density in the information or communication industry are needed with the growth of the market for satellite communication or mobile communication. Frequencies for use in communicating are getting higher and higher. Consequently, much attention has been paid to magnetic garnet, since the magnetic garnet has high electrical resistances and small loss at high frequencies, and such properties are suitable for magnetic materials at high frequencies. Nonreciprocal circuit elements using gyro magnetic effects of magnetic materials are available for elements handling high-frequency signals. Examples of the elements include circulators, isolators and gyrators, in which magnetic garnet is mainly used.

A circulator is explained by way of example of the nonreciprocal circuit elements. In a common distributed element type Y-strip line circulator, garnet disks are placed above and below the strip line, and permanent magnets are arranged so as to accommodate the disks therebetween. The diameter d of the disk giving a minimum insertion loss is expressed below.

$$d = a/(f \cdot (\mu' \cdot \epsilon')^{0.5})$$

where a is constant, f is frequency, $\mu'$ is the real number of the relative permeability, and $\epsilon'$ is the real number of the relative dielectric constant.

The higher the $\mu'$ of the magnetic material is, the smaller the diameter of the magnet disk is. Then, the circulator can be miniaturized. The $\mu'$ is a forward direction permeability $\mu+$' in ferromagnetic resonance, depending on the intensity of the outer direct-current magnetic field. The $\mu'$ maximizes in the outer direct-current magnetic field at a level just under ferromagnetic resonance. Accordingly, the loss component $\mu'$ becomes large, and an insertion loss also gets large. Therefore, the circulator should usually be used in the condition that an outer magnetic field fairly larger than a resonance point is applied, so that the $\mu'$ is not very large. When circulators are used in the same $\mu'$, the $\mu+$' becomes larger with a small gyromagnetic resonance line width of the material, $\Delta H$. The element can thus be miniaturized. Those circumstances are true of small lumped element type circulators, or isolators.

Magnetic garnet is usually used as single-crystal thin films or poly-crystal sintered bodies. The single-crystal is usually formed in a thin film by the liquid phase epitaxy method at about 900° C. using a substrate of gadolinium-gallium-garnet (GGG) single crystal, which was prepared by the Czochralski method. The samples thus prepared have a small gyromagnetic resonance line width $\Delta H$. However, it takes too much time to form a thick film for isolators. Further, the samples are costly. Though use of a poly-crystal results in a $\Delta H$ larger by one order of magnitude than that resulting from use of a single-crystal, the poly-crystal can readily make intended sample sizes. The poly-crystal is much less expensive than the single-crystal. Therefore, sintered bodies of the poly-crystal were more useful for circulators or isolators.

However, common magnetic garnet such as yttrium-iron-garnet ($Y_3Fe_5O_{12}$, so-called YIG) needed high sintering temperatures of 1400° C. or more. Also, garnets in which Gd is substituted for Y or garnets in which Al or Ga is substituted for Fe to adjust saturation magnetic flux density or thermal properties needed high sintering temperatures of 1400° C. or more. Consequently, a specific furnace was required.

To obtain high inductance values for small high-frequency inductors, a configuration called a closed magnetic patch, as shown in FIG. 3, is generally needed. FIG. 3 shows a conventional inductance element in which electrode materials 7 are disposed between garnet sintered bodies 6 and outer electrodes 8 are disposed on the side of garnet sintered bodies 6. On sintering at 1400° C., palladium having a high melting point is needed for inner electrodes. However, palladium is expensive, and it has a relatively high electric resistance. Therefore, the use of palladium results in high manufacturing costs and low Q value for the products.

In the case of circulators, a magnetic flux due to electric current running to the strip line passes alternately across magnetic material and a gap between two magnets, forming a configuration called an open magnetic patch. FIG. 4 shows a circulator having an open magnetic patch in which conductors 10 are outside of the garnet sintered bodies 9. The apparent permeability was influenced by the gap between two magnets in which $\mu'=1$, and decreased below the original permeability of the magnetic material. To solve this problem, the circulators, similar to the inductors, need a closed magnetic patch. A technique of disposing conductors in a magnetic material and sintering the magnetic material and the conductors at the same time was proposed in Technical Report of IEICE, MW94-14, p.17 (1994). However, the proposed technique also suffered from similar problems, resulting in high manufacturing costs and high insertion loss for the products.

SUMMARY OF THE INVENTION

To solve the above-noted problems, the invention provides a magnetic material for microwave which comprises a phase having a garnet structure. The phase comprises a component represented by Formula I $$(A_{3-a}Bi_a)B_xO_y \qquad \text{Formula I}$$

where A represents a component comprising at least one element selected from yttrium (Y) and rare earth elements, the symbol Bi represents bismuth, B represents a component comprising Fe, the symbol O represents oxygen, the letter a represents a number in the range of 0 to less than 2.00, x represents a number in the range of 4.76 to less than 5.00, and y represents a number satisfying the inequality 1.5 (3+x)≤y≤12.

The rare earth elements include scandium (Sc) and 15 lanthanoids. The component represented by A can contain Y, rare earth elements, calcium (Ca) and/or strontium (Sr). The component represented by B can contain titanium (Ti), zirconium (Zr), silicon (St), germanium (Ge), tin (Sn), indium (In), vanadium (V), copper (Cu), molybdenum (Mo), tungsten (W), lead (Pb) and/or boron (B).

It is preferable in the magnetic material that the number represented by a in Formula I ranges from 0.5 to 1.5.

It is preferable in the magnetic material that $(A_{3-a}Bi_a)$ in Formula I is $(Y_{3-a-z}Bi_aR_z)$, and the component is represented by Formula II $$(Y_{3-a-z}Bi_aR_z)B_xO_y \qquad \text{Formula II}$$

where R represents a rare earth element selected from the group consisting of lanthanum (La), neodymium (Nd), samarium (Sm), europium (Eu), gadolinium (Gd), terbium (Tb) and dysprosium (Dy), B represents a component comprising iron (Fe), a represents a number in the range of 0 to less than 2.00, x represents a number in the range of 4.76 to less than 5.00, y represents a number satisfying the inequality $1.5(3+x) \leq y \leq 12$, and when b is one number selected from among 0.1, 0.2, 0.4, 0.6, 0.8, 1.0 and 1.3, z represents a number satisfying the inequalities $0 < a \leq 1.5 + bz$ and $0 < a+z \leq 3$.

It is preferable in the magnetic material that R in Formula II is La, b in Formula II is 1.3, and the component is represented by Formula III

  Formula III where B represents a component comprising Fe, a represents a number in the range of 0 to less than 2.00, x represents a number in the range of 4.76 to less than 5.00, z represents a number in the range of more than 0 to 0.4, and a and z satisfy the inequalities $0 < a \leq 1.5 + 1.3z$ and $0 < a+z \leq 3$.

It is preferable in the magnetic material that R in Formula II is Nd, b in Formula II is 1.0, and the component is represented by Formula IV

  Formula IV where B represents a component comprising Fe, a represents a number in the range of 0 to less than 2.00, x represents a number in the range of 4.76 to less than 5.00, y represents a number satisfying the inequality $1.5(3+x) \leq y \leq 12$, z represents a number in the range of more than 0 to 0.6, and a and z satisfy the inequalities $0 < a \leq 1.5 + 1.0z$ and $0 < a+z \leq 3$.

It is preferable in the magnetic material that R in Formula II is Sm, b in Formula II is 0.8, and the component is represented by Formula V

  Formula V where B represents a component comprising Fe, a represents a number in the range of 0 to less than 2.00, x represents a number in the range of 4.76 to less than 5.00, y represents a number satisfying the inequality $1.5(3+x) \leq y \leq 12$, z represents a number of more than 0, and a and z satisfy the inequalities $0 < a \leq 1.5 + 0.8z$ and $0 < a+z \leq 3$.

It is preferable in the magnetic material that R in Formula II is Eu, b in Formula n is 0.6, and the component is represented by Formula VI

  Formula VI where B represents a component comprising Fe, a represents a number in the range of 0 to less than 2.00, x represents a number in the range of 4.76 to less than 5.00, y represents a number satisfying the inequality $1.5 (3+x) \leq y \leq 12$, z represents a number of more than 0, and a and z satisfy the inequalities $0 < a \leq 1.5 + 0.6z$ and $0 < a+z \leq 3$.

It is preferable in the magnetic material that R in Formula II is Gd, b in Formula II is 0.4, and the component is represented by Formula VII

  Formula VII where B represents a component comprising Fe, a represents a number in the range of 0 to less than 2, x represents a number in the range of 4.76 to less than 5.00, y represents a number satisfying the inequality $1.5(3+x) \leq y \leq 12$, z represents a number of more than 0, and a and z satisfy the inequalities $0 < a \leq 1.5 + 0.4z$ and $0 < a+z \leq 3$.

It is preferable in the magnetic material that R in Formula II is Tb, b in Formula II is 0.2, and the component is represented by Formula VIII

  Formula VIII where B represents a component comprising Fe, a represents a number in the range of 0 to less than 2.00, x represents a number in the range of 4.76 to less than 5.00, y represents a number satisfying the inequality $1.5(3+x) \leq y \leq 12$, z represents a number of more than 0, and a and z satisfy the inequalities $0 < a \leq 1.5 + 0.2z$ and $0 < a+z \leq 3$.

It is preferable in the magnetic material that R in Formula II is Dy, b in Formula II is 0.1, and the component is represented by Formula IX

  Formula IX where B represents a component comprising Fe, a represents a number in the range of 0 to less than 2.00, x represents a number in the range of 4.76 to less than 5.00, y represents a number satisfying the inequality $1.5(3+x) \leq y \leq 12$, z represents a number of more than 0, and a and z satisfy the inequalities $0 < a \leq 1.5 + 0.1z$ and $0 < a+z \leq 3$.

It is preferable in the magnetic material that A in Formula I is Y, B in Formula I is $(Fe_{1-c/x}In_{c/x})$, and the component is represented by Formula X

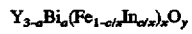  Formula X where a represents a number in the range of 0 to less than 2.00, c represents a number of more than 0 to less than 0.5, a and c satisfy the inequality $0 < a \leq 1.5 + 1.3c$, x represents a number in the range of 4.76 to less than 5.00, and y represents a number satisfying the inequality $1.5 (3+x) \leq y \leq 12$.

It is preferable in the magnetic material that $(A_{3-a}Bi_a)$ in Formula I is $(A_{3-a-b}Ca_bBi_a)$, B in Formula I is $(Fe_{1-c/x-d/x}In_{c/x}V_{d/x})$, and the component is represented by Formula XI

  Formula XI where a represents a number in the range of 0 to less than 2.00, b represents a number satisfying the inequality $0 < a+b \leq 3$, c and d represent numbers satisfying the inequality $0 < c+d \leq 5$, d represents a number satisfying the equation $d=b/2$, x represents a number in the range of 4.76 to less than 5.00, and y represents a number satisfying the inequality $1.5 (3+x) \leq y \leq 12$.

It is preferable that the magnetic material comprises 100 weight parts of the phase having a garnet structure and more than 0 to 1 weight part of vanadium(V) oxide ($V_2O_5$).

It is preferable that the magnetic material comprises 100 weight parts of the phase having a garnet structure and more than 0 to 1 weight part of copper(V) oxide (CuO).

It is preferable that the magnetic material comprises 100 weight parts of the phase having a garnet structure and more than 0 to 1 weight part of molybdenum(VI) oxide ($MoO_3$).

It is preferable that the magnetic material comprises 100 weight parts of the phase having a garnet structure and more than 0 to 1 weight part of tungsten(VI) oxide ($WO_3$).

It is preferable that the magnetic material comprises 100 weight parts of the phase having a garnet structure and more than 0 to 1 weight part of lead(II) oxide (PbO).

It is preferable that the magnetic material comprises 100 weight parts of the phase having a garnet structure and more than 0.05 to 2 weight parts of diboron trioxide ($B_2O_3$).

It is preferable that the magnetic material has a relative sintering density of 95.0 to 99.8%. The relative sintering density here refers to a percentage of experimental density to theoretical density in a sintered body.

Further, the invention provides a component for high-frequency circuit comprising the magnetic material for microwave of the invention in which a conductor was disposed to form a closed magnetic patch. Examples of the component include a nonreciprocal circuit element for high frequency and a high-frequency inductance element.

It is preferable in the component for high-frequency circuit that the conductor comprises silver (Ag) in an amount of 60 wt % or more. The conductor can comprise lead (Pd), Ag-Pd alloy and/or ruthenium(IV) oxide ($RuO_2$) in an amount of less than 40 wt %. The Ag-Pd alloy preferably contains Pd in an amount of less than 40 wt %.

The invention provides garnet ferrite sintered bodies for microwave applications which are prepared by sintering at low temperatures around 900° C. Dense magnetic garnet is readily provided at low costs. Because of sintering at low temperatures, the magnetic garnet canbe sintered with electrode materials such as Ag, or dielectric materials, thereby providing circuit components with high performance and a smaller size.

DETAILED DESCRIPTION OF THE PREFERRED EMBODIMENTS

YIG is mentioned by way of example for magnetic garnet, and a Y-strip line type isolator is mentioned byway of example for nonreciprocal circuit elements. It should not be understood that the invention is limited to the examples. The effects of the invention will be exhibited in other materials in which Al or Ga is substituted for Fe, or materials in which Gd is substituted for Y, or other elements such as isolators and circulators.

EXAMPLE 1

Starting materials were 99.9-purity powder of $Y_2O_3$, $Bi_2O_3$ and $\alpha$-$Fe_2O_3$. We weighed 300 g of the powder, adjusting the final molar ratio of ($Y_2O_3$+$Bi_2O_3$):$Fe_2O_3$ in the sintered body to 3:4.95 and the $Y_2O_3$:$Bi_2O_3$ molar ratio to the ratios shown in Table 1. The weighed powder was mixed in a ball mill, and then calcined at a temperature indicated in Table 1 (Tc) for 2 h, followed by grinding in a ball mill. The calcined powder was molded in a predetermined shape, and the powder was sintered at a temperature indicated in Table 1 (Ts) for 3 h, giving a disk of magnetic garnet having a diameter of 25 mm and a thickness of 1.5 mm. The relative density of the samples was measured.

Figure 2:
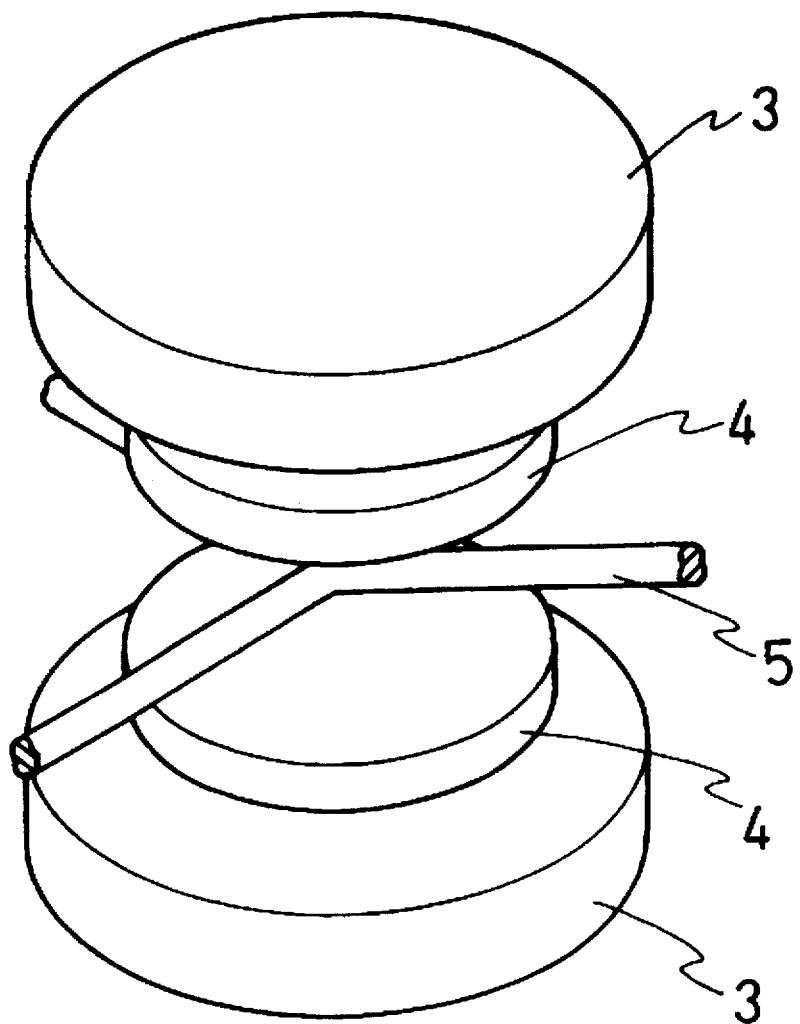
FIG. 2 is an explanatory view of a nonreciprocal circuit element for high-frequency in one embodiment of the invention.
Figure 3:
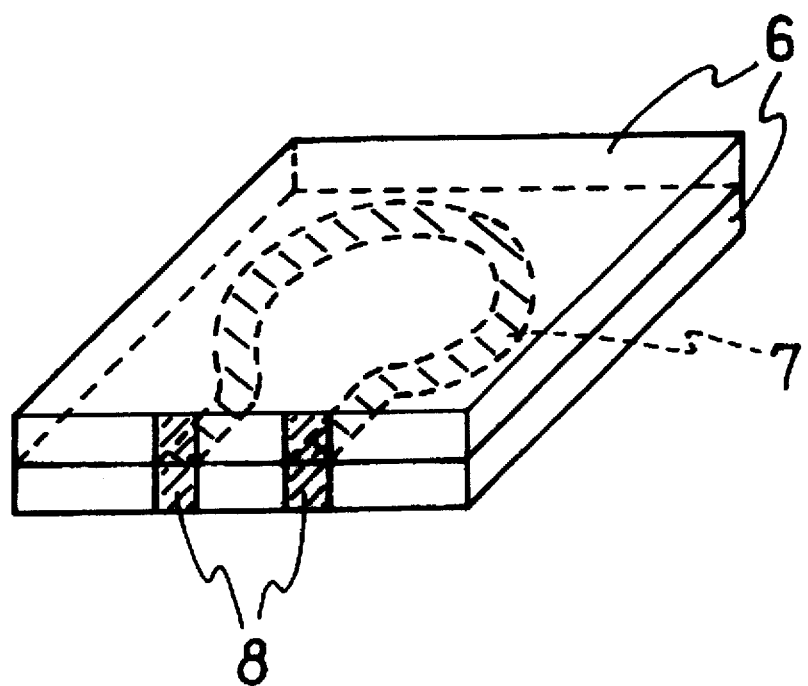
FIG. 3 is a perspective view of a conventional high-frequency inductance element.
Figure 4:
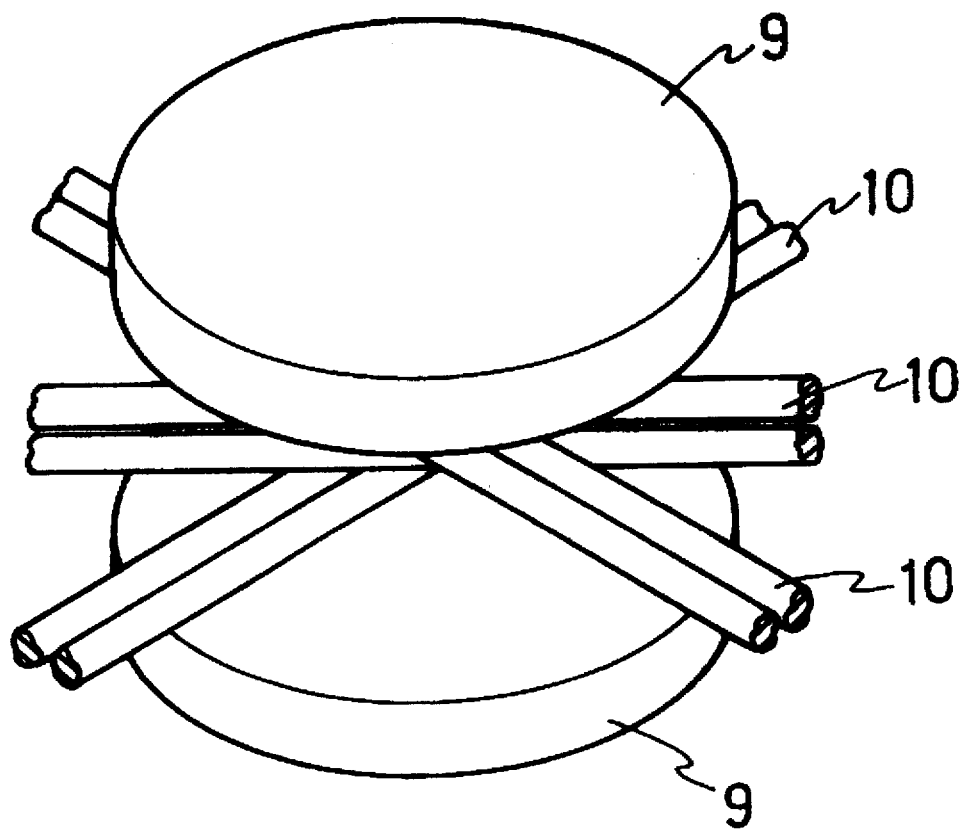
FIG. 4 is a perspective view of a conventional circulator.

FIG. 2 shows the positional correlation between Sr ferrite magnet disks 3, garnet disks 4 and Y-shaped strip line 5; garnet disks 4 were placed above and below Y-shaped strip line 5 and Sr ferrite magnet disks 3 were placed to accommodate the disks 4 and strip line 5 therebetween. Any substances not connecting electrically or magnetically to magnet disks 3, garnet disks 4 and Y-shaped strip line 5 can be present between magnet disk 3 and garnet disk 4, or between garnet disk 4 and strip line 5, or between garnet disks 4.

The sample was accommodated in a magnetic metal case. One end of the strip line was connected with an adsorption resistance, finalizing a distributed element type Y strip line isolator. The maximum isolation and the frequency for the isolator were measured. Further, the insertion loss for samples giving an isolation at the frequency was measured. Table 1 also shows the results of the measurements.

TABLE 1

| No. | Composition Y/Bi | Tc (°C.) | Ts (°C.) | D (%) | MI (dB) | MI (MHz) | IL (dB) |
|---|---|---|---|---|---|---|---|
| 1* | 3.0/0.0 | 1100 | 1400 | 97.8 | 46 | 880 | 0.2 |
| 2* | 3.0/0.0 | 1100 | 1300 | 82.4 | 20 | 970 | 0.6 |
| 3* | 3.0/0.0 | 900 | 1000 | 55.2 | — | — | — |
| 4* | 3.0/0.0 | 700 | 900 | 55.0 | — | — | — |
| 5 | 2.5/0.5 | 1000 | 1400 | 97.0 | 42 | 890 | 0.2 |
| 6 | 2.5/0.5 | 1000 | 1300 | 97.3 | 32 | 880 | 0.2 |
| 7 | 2.5/0.5 | 1000 | 1200 | 91.5 | 27 | 930 | 0.4 |
| 8 | 2.5/0.5 | 900 | 1000 | 78.5 | 19 | 990 | 0.6 |
| 9 | 2.5/0.5 | 800 | 900 | 56.1 | — | — | — |
| 10 | 2.0/1.0 | 900 | 1400 | 89.5 | 22 | 950 | 0.7 |
| 11 | 2.0/1.0 | 900 | 1000 | 97.0 | 38 | 900 | 0.3 |
| 12 | 2.0/1.0 | 900 | 950 | 96.9 | 36 | 920 | 0.4 |
| 13 | 2.0/1.0 | 800 | 900 | 89.3 | 24 | 960 | 0.6 |
| 14 | 2.0/1.0 | 700 | 800 | 56.4 | — | — | — |
| 15 | 1.5/1.5 | 800 | 1000 | 96.4 | 40 | 920 | 0.4 |
| 16 | 1.5/1.5 | 800 | 900 | 95.9 | 36 | 940 | 0.5 |
| 17 | 1.5/1.5 | 700 | 800 | 82.2 | 32 | 980 | 0.7 |

Examples marked with * are comparative examples.
Tc: Calcination Temperature
Ts: Sintering Temperature
D: Density
MI: Maximum Isolation
IL: Insertion Loss As can be seen from Table 1, the magnetic materials of the invention were densified at much lower temperatures compared to conventional sintered bodies. Specifically, some samples were sintered at 900° C. or less. No substantial isolation was found in samples having a density of 60% or less. Samples having a density of 80% or more exhibited an isolation of 20 dB or more and an insertion loss of 1.0 dB or less. The samples were found to be suitable for isolators.

EXAMPLE 2

In the same manner as in Example 1, we weighed 300 g of the powder, adjusting the final molar ratio of $Y_2O_3$:$Bi_2O_3$:$Fe_2O_3$ in the sintered body to 2:1:4.95. The weighed powder was mixed in a ball mill, and then calcined at 850° C. for 5 h. The calcined powder was ground in a ball mill, and then mixed with an organic binder comprising polyvinyl butyral ("ESUDEKKU BM-S", Sekisui Chemical Co., Ltd.). A 400 µm-thick green sheet was formed by the doctor blade process, and the sheet was cut. On the other hand, a conducting paste comprising Ag and vehicle was prepared. The paste was printed as a coil on the green sheet. Another green sheet was placed above. Pressure of 300–500 kg/cm² was applied in the thickness direction to press the green sheets into contact, finalizing a green-sheet laminate having magnetic materials with electrodes disposed therebetween. The laminate was 3.5 mm in diameter and 0.5 mm in thickness. The laminate was sintered at 920° C. for 3 h. Ag paste was applied to the side of the sintered body at the level of the inner conductor. The Ag paste was burned at 700° C. for 10 min to form outer conductors. The resulting inductor was found to have an L value of 200 nH and a Q value of 30 at 100 MHz.

EXAMPLE 3

Figure 1:
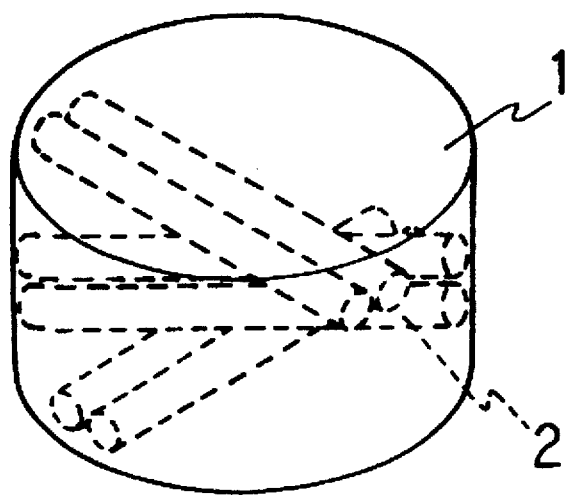
FIG. 1 is a perspective view of a component for high-frequency circuit in one embodiment of the invention.

In the same manner as in Example 1, we weighed 300 g of the powder, adjusting the final molar ratio of $Y_2O_3:Bi_2O_3:Fe_2O_3$ in the sintered body to 2:1:4.95. The weighed powder was mixed in a ball mill, and then calcined at 850° C. for 5 h. The calcined powder was ground in a ball mill, and then was mixed with an organic binder comprising polyvinyl butyral ("ESUDEKKU BM-S", Sekisui Chemical Co., Ltd.). A 400 μm-thick green sheet was formed by the reverse roll coater process, and the sheet was cut into a circle. On the other hand, a conducting paste comprising Ag and vehicle was prepared. The paste was printed as strip lines on the green sheet. Three identical samples were prepared. The three were piled up so that every two adjacent strip lines cross at 120°. Another green sheet was placed above. Pressure of 300–500 kg/cm² was applied in the thickness direction to press the green sheets into contact, finalizing a green-sheet laminate having 4 layers of magnetic materials and 3 layers of electrodes disposed therebetween. The laminate was 3.5 mm in diameter and 0.5 mm in thickness. The laminate was sintered at a temperature indicated in Table 2 (Ts) for 3 h to form a closed magnetic patch. FIG. 1 shows that inner conductors 2 are disposed in garnet sintered body 1.

Ag paste was applied at 6 points on the side of the sintered body at the level of the inner conductor. The Ag paste was burned at 700° C. for 10 min to form outer conductors. Among the 6 electrodes, three electrodes spaced at angles of 120° were grounded. Another electrode was grounded through an adsorption resistance and terminated. At the rest of the electrodes, a terminal and a load were disposed. Further, Sr ferrite disks were placed to accommodate the disks therebetween. The sample was accommodated in a magnetic metal case, finalizing a lumped element type isolator for 1.9 GHz. The isolator was 7 millimeters long, 7 millimeters wide and 2.3 millimeters thick.

For comparison, lumped element type isolators were similarly formed in a condition indicated in Table 2. Conventional lumped element type isolators having an open magnetic patch were also formed. In those cases, magnetic material and electrodes were placed independently. The size of the magnetic material used was 5 mm diameter and 0.5 mm thick for the closed-magnetic-patch isolators and the conventional isolators. The isolation relative band width for the resulting isolators and the insertion loss were measured. The isolation relative band width here refers to a ratio of frequency band width giving isolation of 20 dB or more to maximum isolation frequency. Table 2 also shows the results of the measurement.

netic materials of the invention together with inner electrode of Ag were sintered at 900° C. to form a closed magnetic patch. As a result, wide relation band width and low insertion loss were obtained. Instead of Ag, other materials such as Pd, Pd-Ag alloy or $RuO_2$ were available for electrodes. Samples using the other electrode materials were sintered at low temperature and exhibited wide band width. However, insertion loss was rather large, since the resistance of electrode was high.

In the cases of conventional YIG containing no Bi, no isolators were formed when Ag inner electrode was similarly sintered at the same time to form a closed magnetic patch. This is possibly because YIG was not fully densified at the low temperatures and when YIG was in turn densified at high temperatures, which considerably exceeds the melting point of Ag, the electrodes were broken. In this case, sintering an inner electrode of Pd at 1400° C. resulted in good isolators. However, there were some problems; Pd was expensive, high temperatures were needed for sintering, and the insertion loss was rather large.

EXAMPLE 4

Starting materials were 99.9-purity powder of $Y_2O_3$, $Bi_2O_3$, $\alpha\text{-}Fe_2O_3$, $V_2O_5$ and CuO. We weighed 300 g of the powder, adjusting the final molar ratio of $(Y_2O_3+Bi_2O_3)$ :$Fe_2O_3$ in the sintered body to 3:4.95, and the Bi amount to the amount referred to as x indicated in Tables 3 and 4. As an additive, $V_2O_5$ or CuO was mixed in an amount of the weight parts indicated in Table 3 or 4, provided that 300 g of the weighed powder was 100 weight parts. Each experimental powder was mixed in a ball mill, and then calcined at 900° C. for 2 h. The calcined powder was ground in a ball mill, and then molded in a predetermined shape of 12 mm in diameter and 3 mm in thickness. The molded powder was sintered for 3 h at a temperature from 750° to 1450° C. at intervals of 50° C. The relative density of the samples was measured. The lowest statering temperatures giving a relative density of 90% or more were determined. Tables 3 and 4 show the results, indicating temperatures on the centigrade scale. Further, the sintered bodies were ground, and the produced phase was identified by X-ray diffraction.

TABLE 2

| No. | Magnetic Patch | Composition Y/Bi | E | Ts (°C.) | IRBW (%) | IL (dB) |
|---|---|---|---|---|---|---|
| 18* | Open | 2.0/1.0 | Ag | 950 | 4 | 0.8 |
| 19 | Closed | 2.0/1.0 | Ag | 950 | 7 | 0.7 |
| 20 | Closed | 2.0/1.0 | Ag | 1000 | 8 | 0.7 |
| 21 | Closed | 2.0/1.0 | Ag | 900 | 6 | 0.8 |
| 22* | Closed | 2.0/1.0 | Pd | 900 | 6 | 1.1 |
| 23* | Closed | 2.0/1.0 | Ag—Pd | 900 | 6 | 0.9 |
| 24* | Closed | 2.0/1.0 | $RuO_2$ | 900 | 6 | 1.2 |
| 25* | Open | 3.0/0.0 | Ag | 1400 | 4 | 0.7 |
| 26* | Closed | 3.0/0.0 | Ag | 900 | — | — |
| 27* | Closed | 3.0/0.0 | Ag | 1000 | — | — |
| 28* | Closed | 3.0/0.0 | Ag | 1200 | — | — |
| 29* | Closed | 3.0/0.0 | Ag | 1400 | — | — |
| 30* | Closed | 3.0/0.0 | Pd | 1400 | 8 | 1.0 |

Examples marked with * are comparative examples.
E: Electrode
Ts: Sintering Temperature
IRBW: Isolation Relative Bandwidth
IL: Insertion Loss As can be seen from Table 2, the samples having closed magnetic patch had a wide relation band width. The mag-

TABLE 3

| | $V_2O_5$ | Bi amount x ($Y_{3-x}Bi_xFe_{4.95}O_{12}$) | | | | | |
|---|---|---|---|---|---|---|---|
| No. | (weight part) | 0 | 0.5 | 0.7 | 1.0 | 1.5 | 2.0 |
| 31 | 0 | 1350 | 1150 | 1050 | 950 | 950 | 850 |
| 32 | 0.02 | 1250 | 1050 | 900 | 900 | 900 | 850 |
| 33 | 0.05 | 1250 | 1050 | 900 | 900 | 900 | 850 |
| 34 | 0.1 | 1250 | 1050 | 900 | 850 | 850 | 850 |
| 35 | 0.2 | 1250 | 1000 | 900 | 850 | 850 | 850 |
| 36 | 0.5 | 1200 | 1000 | 900 | 850 | 850 | 850 |
| 37 | 1.0 | 1200 | 1000 | 900 | 850 | 850 | 850 |
| 38 | 2.0 | 1200 | 1000 | 900 | 850 | 850 | 850 |

TABLE 4

| | CuO | Bi amount x ($Y_{3-x}Bi_xFe_{4.95}O_{12}$) | | | | | |
|---|---|---|---|---|---|---|---|
| No. | (weight part) | 0 | 0.5 | 0.7 | 1.0 | 1.5 | 2.0 |
| 39 | 0 | 1350 | 1150 | 1050 | 950 | 950 | 850 |
| 40 | 0.02 | 1300 | 1100 | 900 | 900 | 900 | 850 |
| 41 | 0.05 | 1300 | 1100 | 900 | 900 | 900 | 850 |
| 42 | 0.1 | 1250 | 1050 | 900 | 850 | 850 | 850 |
| 43 | 0.2 | 1250 | 1000 | 900 | 850 | 850 | 850 |

TABLE 4-continued

| No. | CuO (weight part) | Bi amount x $(Y_{3-x}Bi_xFe_{4.95}O_{12})$ | | | | | |
|---|---|---|---|---|---|---|---|
| | | 0 | 0.5 | 0.7 | 1.0 | 1.5 | 2.0 |
| 44 | 0.5 | 1250 | 1000 | 900 | 850 | 850 | 850 |
| 45 | 1.0 | 1200 | 1000 | 900 | 850 | 850 | 850 |
| 46 | 2.0 | 1200 | 1000 | 900 | 850 | 850 | 850 |

As can be seen from Tables 3 and 4, the magnetic materials comprising $V_2O_5$ or CuO were densified at much lower temperatures, independently of x values. Specifically, when x was 0.7 or more, and $V_2O_5$ or CuO was added in an amount of 0.02 weight part (0.06 g), the sample was sintered at 900° C. or less, giving a density of 90% or more. However, when the Bi amount was 2.0 or more, or the additive was present in an amount of 2.0 weight parts (6.0 g), no garnet single phase was obtained, and secondary phase appeared. The adding after sintering had the same effects as the adding before sintering.

EXAMPLE 5

Starting materials were 99.9-purity powder of $Y_2O_3$, $Bi_2O_3$, $\alpha$-$Fe_2O_3$, $V_2O_5$, CuO, $MoO_3$, $WO_3$ and PbO. We weighed 300 g of the powder. The final molar ratio of $(Y_2O_3+Bi_2O_3):Fe_2O_3$ in the sintered body was 3:4.95. The molar ratio of Y:Bi was 3:0 as indicated in Table 5, 2.5:0.5 as indicated in Table 6, 2.3:0.7 as indicated in Table 7, and 2:1 as indicated in Table 8. As an additive, $V_2O_5$, CuO, $MoO_3$, $NO_3$ or PbO was mixed in an amount of the weight parts indicated in Tables 5–8, provided that 300 g of the weighed powder was 100 weight parts. Each experimental powder was mixed in a ball mill, and then calcined for 2 h at a temperature indicated in Table 5, 6, 7 or 8. The calcined powder was ground in a ball mill, and then molded in a predetermined shape of 12 mm in diameter and 3 mm in thickness. The molded powder was sintered for 3 h at a temperature from 750° to 1450° C. at intervals of 50° C. The relative density of samples was measured. The lowest sintering temperatures giving a relative density of 90% or more were determined. Tables 5–8 also show the results, indicating temperatures on the centigrade scale. Further, the sintered bodies were ground, and the produced phase was identified by X-ray diffraction.

TABLE 5

Y:Bi = 3:0 (Calcination at 1100° C.)

| No. | Additive | Additive Amount (weight part) | | | | | | | |
|---|---|---|---|---|---|---|---|---|---|
| | | 0 | 0.02 | 0.05 | 0.1 | 0.2 | 0.5 | 1.0 | 2.0 |
| 47 | $V_2O_5$ | 1350 | 1250 | 1250 | 1250 | 1250 | 1200 | 1200 | 1200 |
| 48 | CuO | 1350 | 1300 | 1300 | 1250 | 1250 | 1250 | 1200 | 1200 |
| 49 | $MoO_3$ | 1350 | 1300 | 1300 | 1300 | 1250 | 1250 | 1250 | 1250 |
| 50 | $WO_3$ | 1350 | 1300 | 1300 | 1300 | 1250 | 1250 | 1250 | 1250 |
| 51 | PbO | 1350 | 1350 | 1300 | 1300 | 1300 | 1300 | 1300 | 1300 |

TABLE 6

Y:Bi = 2.5:0.5 (Calcination at 1000° C.)

| No. | Additive | Additive Amount (weight part) | | | | | | | |
|---|---|---|---|---|---|---|---|---|---|
| | | 0 | 0.02 | 0.05 | 0.1 | 0.2 | 0.5 | 1.0 | 2.0 |
| 52 | $V_2O_5$ | 1150 | 1050 | 1050 | 1050 | 1000 | 1000 | 1000 | 1000 |
| 53 | CuO | 1150 | 1100 | 1100 | 1050 | 1000 | 1000 | 1000 | 1000 |
| 54 | $MoO_3$ | 1150 | 1100 | 1100 | 1050 | 1050 | 1050 | 1050 | 1050 |
| 55 | $WO_3$ | 1150 | 1100 | 1100 | 1100 | 1050 | 1050 | 1050 | 1050 |
| 56 | PbO | 1150 | 1150 | 1100 | 1100 | 1100 | 1050 | 1050 | 1050 |

TABLE 7

Y:Bi = 2.3:0.7 (Calcination at 900° C.)

| No. | Additive | Additive Amount (weight part) | | | | | | | |
|---|---|---|---|---|---|---|---|---|---|
| | | 0 | 0.02 | 0.05 | 0.1 | 0.2 | 0.5 | 1.0 | 2.0 |
| 57 | $V_2O_5$ | 1050 | 900 | 900 | 900 | 900 | 900 | 900 | 900 |
| 58 | CuO | 1050 | 900 | 900 | 900 | 900 | 900 | 900 | 900 |
| 59 | MoO | 1050 | 1000 | 950 | 900 | 900 | 900 | 900 | 900 |
| 60 | $WO_3$ | 1050 | 1000 | 1000 | 950 | 900 | 900 | 900 | 900 |
| 61 | PbO | 1050 | 1000 | 1000 | 1000 | 950 | 950 | 950 | 950 |

TABLE 8

Y:Bi = 2:1 (Calcination at 900° C.)

| No. | Additive | Additive Amount (weight part) | | | | | | | |
|---|---|---|---|---|---|---|---|---|---|
| | | 0 | 0.02 | 0.05 | 0.1 | 0.2 | 0.5 | 1.0 | 2.0 |
| 62 | $V_2O_5$ | 950 | 900 | 900 | 850 | 850 | 850 | 850 | 850 |
| 63 | CuO | 950 | 900 | 900 | 850 | 850 | 850 | 850 | 850 |
| 64 | $MoO_3$ | 950 | 950 | 900 | 900 | 900 | 900 | 900 | 900 |
| 65 | $WO_3$ | 950 | 950 | 900 | 900 | 900 | 900 | 900 | 900 |
| 66 | PbO | 950 | 950 | 950 | 900 | 900 | 900 | 900 | 900 |

As can be seen from Tables 5–8, the magnetic materials comprising $V_2O_5$, CuO, $MoO_3$, $WO_3$ or PbO were densified at much lower temperatures even when no Bi was present. The samples were sintered at lower temperatures with increasing Bi amount. Specifically, when the ratio of Y:Bi was 2.5:0.5, or 2.3:0.7, the density of samples containing a certain amount of the additive, sintered at 900° C. or less, was 90% or more; the amount of the additive was $V_2O_5$ in an amount of 0.02 weight part or more, CuO in an amount of 0.02 weight part or more, $MoO_3$ in an amount of 0.1 weight part or more, or $WO_3$ in an amount of 0.2 weight part or more. When the ratio of Y:Bi was 2:1, the amount of the additive was $V_2O_5$ in an amount of 0.02 weight part or more, CuO in an amount of 0.02 weight part or more, $MoO_3$ in an amount of 0.05 weight part or more, $WO_3$ in an amount of 0.05 weight part or more, or PbO in an amount of 0.1 weight part. However, when the amount of the additive was 2.0 weight parts or more, no garnet single phase was obtained, and secondary phase appeared. The addition of $V_2O_5$ or CuO particularly promoted densification in sintering at low temperatures. The adding after sintering had the same effects as the adding before sintering.

EXAMPLE 6

Starting materials were 99.9-purity powder of $Y_2O_3$, $Bi_2O_3$, $\alpha$-$Fe_2O_3$ and $V_2O_5$. We weighed 300 g of the powder, adjusting the final molar ratio of $(Y_2O_3+Bi_2O_3):Fe_2O_3$ in the sintered body to 3:4.95, and the molar ratio of Y:Bi to 2:1.

$V_2O_5$ (0.3 g) was added to the weighed powder. The weighed powder was mixed in a ball mill, and then calcined at 900° C. for 2 h. The calcined powder was ground in a ball mill, and then molded in a predetermined shape. The molded powder was sintered at 900° C. for 3 h, giving a disk of magnetic garnet having a diameter of 25 mm and a thickness of 1.5 mm. The disks were placed above and below Y-shaped strip line. Further, Sr ferrite disks were placed to accommodate the disks therebetween. The sample was accommodated in a magnetic metal case. One end of the strip line was connected with a resistance for terminator, finalizing a distributed element type Y strip line isolator. The insertion loss for the samples at 1 GHz was found to be 0.35 dB.

The magnetic materials comprising $V_2O_5$ were densified at much lower temperatures, specifically, 900° C. or less, compared to conventional sintered bodies. The samples exhibiting an insertion loss of 0.5 dB or less were found to be available for isolators.

EXAMPLE 7

In the same manner as in Example 4, we weighed 300 g of the powder, adjusting the final molar ratio of $Y_2O_3:Bi_2O_3:Fe_2O_3$ in the sintered body to 2:1:4.95. $V_2O_5$ or CuO (0.3 g) was added to the weighed powder. Each experimental powder was mixed in a ball mill, the powder was calcined at 850° C. for 5 h, and the powder was ground in a ball mill. The calcined powder was mixed with an organic binder comprising polyvinyl butyral ("ESUDEKKU BM-S", Sekisui Chemical Co., Ltd.). A 400 μm-thick green sheet was formed by the reverse roll coater process, and the sheet was cut into a circle. On the other hand, a conducting paste comprising Ag and ethylcellulose-based vehicle was prepared by using 80 wt % of Ag powder and 20 wt % of ethylcellulose and 2-(2-n-butoxyethoxy)ethylacetate. The paste was printed as strip lines on the green sheet. Three identical samples were prepared. The three were piled up so that every two adjacent strip lines cross at 120°. Another green sheet was placed above. Pressure of 300–500 kg/cm² was applied in the thickness direction to press the green sheets into contact, finalizing a green-sheet laminate having 4 layers of magnetic materials and 3 layers of electrodes disposed therebetween. The laminate was 3.5 mm in diameter and 0.5 mm in thickness. The laminate was sintered at 900° C. for 3 h to form a closed magnetic patch. Ag paste was applied at 6 points on the side of the sintered body at the level of inner conductor. The Ag paste was burned at 700° C. for 10 min to form outer conductors. Among the 6 electrodes, three electrodes spaced at angles of 120° were grounded. Another electrode was grounded through a matching resistance to terminate. At the rest of the electrodes, a terminal and a load were disposed. Further, magnet disks were placed to accommodate the disks therebetween. The sample was accommodated in a magnetic metal case, finalizing a lumped element type isolator for 1.9 GHz. The isolator was 7 millimeters long, 7 millimeters wide and 2.3 millimeters thick.

For comparison, lumped element type isolators were similarly formed in a condition indicated in Table 9. Conventional lumped element type isolators having an open magnetic patch were also formed. In those cases, magnetic material and electrodes were placed independently. The size of the magnetic material used was 5 mm diameter and 0.5 mm thick in the closed-magnetic-patch isolators and the conventional isolators. The isolation relative band width for the resulting isolators and the insertion loss were measured. The isolation relative band width here refers to a ratio of frequency band width giving isolation of 20 dB or more to maximum isolation frequency. Table 9 also shows the results of the measurement.

TABLE 9

| No. | Magnetic Patch | E | Composition Y/Bi | Additive | Ts (°C.) | RBW (%) | IL (dB) |
|---|---|---|---|---|---|---|---|
| 67 | Closed | Ag | 2.0/1.0 | 0 | 900 | 6 | 0.8 |
| 68 | Closed | Ag | 2.0/1.0 | 0.1 weight part $V_2O_5$ | 900 | 6 | 0.65 |
| 69 | Closed | Ag | 2.0/1.0 | 0.1 weight part CuO | 900 | 6 | 0.65 |
| 70* | Closed | Pd | 2.0/1.0 | 0.1 weight part $V_2O_5$ | 900 | 6 | 1.1 |
| 71* | Closed | Ag | 3.0/0.0 | 0 | 900 | — | — |
| 72* | Closed | Pd | 3.0/0.0 | 0 | 1400 | 8 | 1.0 |
| 73* | Open | Ag | 3.0/0.0 | 0 | 1400 | 4 | 0.7 |

E: Electrode
Ts: Sintering Temperature
RBW: Relative Bandwidth
IL: Insertion Loss As can be seen from Table 9, samples having closed magnetic patch were found to have a wide relative band width. The magnetic materials comprising $V_2O_5$, CuO or Bi, together with inner electrode of Ag were sintered at 900° C. to form a closed magnetic patch. As a result, wide relative band width and low insertion loss were obtained. When samples contained Bi without containing $V_2O_5$ or CuO, the samples exhibited rather large insertion loss. It is thought that the samples not containing $V_2O_5$ or CuO were not fully densified by sintering at 900° C., and increased insertion loss. When samples contained Bi and Ag as electrodes was replaced with Pd, Ag-Pd alloy or $RuO_2$, the samples also exhibited rather large insertion loss. It is thought that non-Ag electrodes had a large electric resistance.

In the cases of conventional YIG not containing $V_2O_5$, CuO or Bi, no isolators were formed when an Ag inner electrode was sintered simultaneously to form a closed magnetic patch. It is thought that YIG was hardly densified at low temperatures, and when YIG was densified at high temperatures, which considerably exceeded the melting point of Ag, electrodes were broken. In this case, sintering an inner electrode of Pd at 1400° C. resulted in good isolators. However, there were some problems; Pd was expensive, high temperatures were needed for sintering, and the insertion loss was rather large.

EXAMPLE 8

Starting materials were powder of $Y_2O_3$, $Bi_2O_3$, $\alpha$-$Fe_2O_3$ and $B_2O_3$. The powder had a purity of 99.9% or more. We weighed 300 g of the powder, adjusting the final molar ratio of $(Y_2O_3+Bi_2O_3):Fe_2O_3$ in the sintered body to 3:4.95, and the Bi amount to the amount referred to as x indicated in Table 10. Each experimental powder was mixed in a ball mill, and then calcined at 800° C. for 2 h. $B_2O_3$ in an amount of the weight parts indicated in Table 10 was added to the calcined powder, and the powder was ground in a ball mill. The calcined powder was molded in a predetermined shape of 12 mm in diameter and 3 mm in thickness, and then sintered for 3 h at a temperature from 750° to 1450° C. at intervals of 50° C. The relative density of the samples was measured. The lowest sintering temperatures giving a relative density of 90% or more were determined. Table 10 shows the results, indicating temperatures on the centigrade scale. Further, the sintered bodies were ground, and the produced phase was identified by X-ray diffraction.

TABLE 10

| No. | $B_2O_3$ (weight part) | Bi amount x $(Y_{3-x}Bi_xFe_{4.95}O_{12})$ | | | | | | |
|---|---|---|---|---|---|---|---|---|
| | | 0.00 | 0.25 | 0.50 | 0.75 | 1.0 | 1.50 | 2.00 |
| 74 | 0 | 1350 | 1250 | 1150 | 1050 | 950 | 950 | 850 |
| 75 | 0.03 | 1350 | 1250 | 1150 | 1050 | 950 | 950 | 850 |
| 76 | 0.05 | 1300 | 1200 | 1100 | 1000 | 900 | 900 | 850 |
| 77 | 0.1 | 1250 | 1150 | 1000 | 950 | 850 | 850 | 850 |
| 78 | 0.5 | 1200 | 1100 | 900 | 900 | 850 | 850 | 850 |
| 79 | 1.0 | 1200 | 1100 | 900 | 900 | 850 | 850 | 850 |
| 80 | 2.0 | 1200 | 1100 | 900 | 900 | 850 | 850 | 850 |
| 81 | 3.0 | 1150 | 1050 | 900 | 900 | 850 | 850 | 850 |

As can be seen from Table 10, the magnetic materials comprising $B_2P_3$ in an amount of 0.05 weight part or more were densified at much lower temperatures. Specifically, when x was 0.5 or more, the sample was sintered at 900° C. or less. However, when the Bi amount was 2.0 or more, and when $B_2O_3$ in an amount of 3.0 weight parts was added to 300 g of the starting powder, no garnet single phase was obtained, and secondary phase appeared. The adding after sintering had the same effects as the adding before sintering.

EXAMPLE 9

Starting materials were powder of $Y_2O_3$, $Bi_2O_3$, $\alpha$-$Fe_2O_3$, $B_2O_3$, $V_2O_5$, CuO, $MoO_3$, $WO_3$ and PbO. The powder had a purity of 99.9% or more. We weighed 300 g of the powder. The final molar ratio of $Y_2O_3$:$Bi_2O_3$:$Fe_2O_3$ in the sintered body was 2.4:0.6:4.95. As an additive, $V_2O_5$, CuO, $MoO_3$, $WO_3$ or PbO was mixed in the amount of the weight parts indicated in Table 11. Each experimental powder was mixed in a ball mill, and then calcined at 850° C. for 2 h. $B_2O_3$ (0.3 g) was added to the calcined powder, and the powder was ground in a ball mill. The calcined powder was molded in a predetermined shape of 12 mm in diameter and 3 mm in thickness, and the powder was sintered for 3 h at a temperature from 750° to 1450° C. at intervals of 50° C. The relative density of the samples was measured. The lowest sintering temperatures giving a relative density of 90% or more were determined. Table 11 shows the results, indicating temperatures on the centigrade scale. Further, the sintered bodies were ground, and the produced phase was identified by X-ray diffraction.

TABLE 11

| No. | Additive | Additive Amount (weight part) | | | | | | | |
|---|---|---|---|---|---|---|---|---|---|
| | | 0 | 0.02 | 0.05 | 0.10 | 0.20 | 0.50 | 1.00 | 2.00 |
| 82 | $V_2O_5$ | 1000 | 950 | 900 | 850 | 850 | 850 | 850 | 850 |
| 83 | CuO | 1000 | 950 | 900 | 850 | 850 | 850 | 850 | 850 |
| 84 | $MoO_3$ | 1000 | 1000 | 950 | 900 | 900 | 900 | 850 | 850 |
| 85 | $WO_3$ | 1000 | 1000 | 950 | 900 | 900 | 900 | 850 | 850 |
| 86 | PbO | 1000 | 1000 | 950 | 950 | 950 | 950 | 900 | 900 |

As can be seen from Table 11, the magnetic materials comprising $B_2O_3$ and any of $V_2O_5$, CuO, $MoO_3$, $WO_3$ and PbO were densified at much lower temperatures. However, when the additive was 2.0 weight parts or more, no garnet single phase was obtained, and secondary phase appeared. The adding after sintering had the same effects as the adding before sintering.

EXAMPLE 10

Starting materials were 99.9-purity powder of $Y_2O_3$, $Bi_2O_3$, $\alpha$-$Fe_2O_3$ and $V_2O_5$. We weighed 300 g of the powder, adjusting the final molar ratio of $(Y_2O_3+Bi_2O_3)$:$Fe_2O_3$ in the sintered body to 3:4.95, and the molar ratio of Y:Bi to 2.2:0.8. $V_2O_5$ (0.3 g) was added to the powder. The weighed powder was mixed in a ball mill, and then calcined at 900° C. for 2 h. $B_2O_3$ in an amount of the weight parts indicated in Table 12 was added to the calcined powder, and the powder was ground in a ball mill. The calcined powder was molded in a predetermined shape, and then sintered at a temperature indicated in Table 12 for 5 h in the conventional manner, giving a disk of magnetic garnet having a diameter of 25 mm and a thickness of 1.5 mm (sintering is referred to as "Common" in Table 12). Comparative samples sintered by the hot press method were also prepared. The density of samples was measured. The disks were placed above and below Y-shaped strip line. Further, Sr ferrite disks were placed to accommodate the disks therebetween. The sample was accommodated in a magnetic metal case. One end of the strip line was connected with a resistance for terminator, finalizing a distributed element type Y strip line isolator. The insertion loss for the samples at 1 GHz was measured. Table 12 also shows the results of the measurement.

TABLE 12

| No. | Sintering | Ts (°C.) | $B_2O_3$ (weight part) | Density (%) | IL (dB) |
|---|---|---|---|---|---|
| 87# | Common | 800 | 1.0 | 70.5 | — |
| 88# | Common | 825 | 1.0 | 84.3 | — |
| 89# | Common | 850 | 1.0 | 93.0 | 1.20 |
| 90 | Common | 875 | 1.0 | 95.2 | 0.48 |
| 91# | Common | 900 | 0.0 | 96.3 | 0.41 |
| 92# | Common | 900 | 0.03 | 96.7 | 0.36 |
| 93 | Common | 900 | 0.05 | 97.2 | 0.28 |
| 94 | Common | 900 | 0.1 | 98.8 | 0.22 |
| 95 | Common | 900 | 0.5 | 99.4 | 0.16 |
| 96 | Common | 900 | 1.0 | 99.8 | 0.11 |
| 97 | Common | 900 | 2.0 | 98.1 | 0.27 |
| 98# | Common | 900 | 3.0 | 97.6 | 0.55 |
| 99 | Common | 925 | 1.0 | 99.3 | 0.18 |
| 100 | Common | 950 | 1.0 | 97.9 | 0.29 |
| 101# | Hot Press | 900 | 0.0 | 99.9 | 0.12 |
| 102# | Hot Press | 900 | 0.1 | 99.9 | 0.13 |
| 103# | Hot Press | 900 | 1.0 | 99.99 | 0.15 |

Ts: Sintering Temperature
IL: Insertion Loss

As can be seen from Table 12, sample Nos. 87–89, sintered at a low temperature, having a density of less than 95% were found not to be suitable for a practical isolator, or the samples exhibited a large insertion loss. Sample No. 90 having a density of more than 95% exhibited an insertion loss of 0.48 dB. This value was important to the practical use as isolators. Sample Nos. 91–97 were all suitable for practical use. Specifically, sample Nos. 93–97 comprising $B_2O_3$ in an amount of 0.05 to 2.0 weight parts had an insertion loss of less than 0.3 dB. Those samples were found to have sufficient properties. Sample No. 96 comprising additive in an amount of 1.0 weight part was found to have the maximum density 99.8% and insertion loss of 0.11 dB. Sample No. 98 had a considerably high density, but had a large insertion loss of 0.55 dB. This seems to be because secondary phase precipitated.

Sample Nos. 99 and 100 were sintered at a high temperature to increase the density. However, the density was not increased well. The inventors tried to increase the density of sample Nos. 101–103 by the hot press method. As a result, the density of 99.9% or more was obtained, however, insertion loss was not improved well.

As explained above, from the viewpoint of insertion loss, sintered bodies need a density of 95% or more. To increase a density up to 99.9% or more, a specific sintering such as the hot press method is needed. That can reduce productivity down and increase manufacturing costs, attempting to improve properties of the product. Therefore, it is preferable that sintered bodies have a density of 95–99.8%.

EXAMPLE 11

In the same manner as in Example 8, we weighed 300 g of the powder, adjusting the final molar ratio of $Y_2O_3:Bi_2O_3:Fe_2O_3$ in the sintered body to 2.2:0.8:4.95. The weighed powder was mixed in a ball mill, and then calcined at 850° C. for 5 h. $B_2O_3$ (1.5 g) was added to the powder, and the powder was ground in a ball mill. The calcined powder was mixed with an organic binder comprising polyvinyl butyral ("ESUDEKKU BM-S", Sekisui Chemical Co., Ltd.). A 400 μm-thick green sheet was formed by the doctor blade process, and the sheet was cut into a circle. On the other hand, a conducting paste comprising Ag and ethylcellulose-based vehicle was prepared using 80 wt % of Ag powder and 20 wt % of ethylcellulose and 2-(2-n-butoxyethoxy)ethylacetate. The paste was printed as strip lines on the green sheet. Three identical samples were prepared. The three were piled up so that every two adjacent strip lines cross at 120° Another green sheet was placed above. Pressure of 300–500 kg/cm² was applied in the thickness direction to press the green sheets into contact, finalizing a green-sheet laminate having 4 layers of magnetic materials and 3 layers of electrodes disposed therebetween. The laminate was 3.5 mm in diameter and 0.5 mm in thickness. The laminate was sintered at 900° C. for 3 h to form a closed magnetic patch. Ag paste was applied at 6 points on the side of the sintered body at the level of the inner conductor. The Ag paste was burned at 700° C. for 10 min to form outer conductors. Among the 6 electrodes, three electrodes spaced at angles of 120° were grounded. Another electrode was grounded through a matching resistance to terminate. At the rest of the electrodes, a terminal and a load were disposed. Further, magnetic disks were placed to accommodate the disks therebetween. The sample was accommodated in a magnetic metal case, finalizing a lumped element type isolator for 1.9 GHz. The isolator was 7 millimeters long, 7 millimeters wide and 2.3 millimeters thick.

For comparison, lumped element type isolators were similarly formed in a condition indicated in Table 13. Conventional lumped element type isolators having open magnetic patch were also formed. In those cases, magnetic material and electrodes were placed independently. The size of the magnetic material used was 5 mm diameter and 0.5 mm thick in the closed-magnetic-patch isolators and the conventional isolators. The isolation relative band width for the resulting isolators and the insertion loss were measured. The isolation relative band width here refers to a ratio of frequency band width giving isolation of 20 dB or more to maximum isolation frequency. Table 13 also shows the results of the measurements.

TABLE 13

| No. | Magnetic Patch | E | Composition Y/Bi | Additive | Ts (°C.) | RBW (%) | IL (dB) |
|---|---|---|---|---|---|---|---|
| 104 | Closed | Ag | 2.0/0.8 | 0 | 900 | 6 | 0.8 |
| 105 | Closed | Ag | 2.2/0.8 | 0.5 weight part $B_2O_3$ | 900 | 6 | 0.55 |
| 106 | Closed | Ag | 2.2/0.8 | 0.5 weight part $B_2O_3$ | 900 | 6 | 0.45 |

TABLE 13-continued

| No. | Magnetic Patch | E | Composition Y/Bi | Additive | Ts (°C.) | RBW (%) | IL (dB) |
|---|---|---|---|---|---|---|---|
| 107* | Closed | Pd | 2.2/0.8 | +0.1 weight part CuO 0.5 weight part $B_2O_3$ | 900 | 6 | 1.1 |
| 108* | Closed | Ag | 3.0/0.0 | 0 | 900 | — | — |
| 109* | Closed | Pd | 3.0/0.0 | 0 | 1400 | 8 | 1.0 |
| 110* | Open | Ag | 3.0/0.0 | 0 | 1400 | 4 | 0.7 |

Examples marked with * are comparative examples.
E: Electrode
Ts: Sintering Temperature
RBW: Relative BandWidth
IL: Insertion Loss As can be seen from Table 13, samples having a closed magnetic patch were found to have a wide relative band width. The magnetic materials comprising $B_2O_3$ and Bi together with inner electrode of Ag were sintered at 900° C. to form a closed magnetic patch. As a result, wide relative band width and low insertion loss were obtained. Samples mixed with $B_2O_3$ and another additive such as CuO, for example, sample No. 106, exhibited further lower insertion loss. When samples contained Bi but not $B_2O_3$, the samples exhibited rather large insertion loss. It is thought that the samples not containing $B_2O_3$ were not fully densified by sintering at 900° C., and increased insertion loss. When the samples contained Bi and Ag was replaced as electrodes with Pd, Ag-Pd alloy or $RuO_2$, the samples also exhibited a rather large insertion loss. It is thought that non-Ag electrodes had a large electric resistance.

In the cases of conventional YIG containing no Bi, no isolators were formed when the Ag inner electrode was sintered at the same time to form a closed magnetic patch. It is thought that YIG was hardly densified at low temperatures and when YIG was densified at high temperatures, which considerably exceeded the melting point of Ag, electrodes were broken. In this case, sintering an inner electrode of Pd at 1400° C. resulted in good isolators. However, there were some problems; Pd was expensive, high temperatures were needed for sintering, and the insertion loss was rather large.

EXAMPLE 12

Starting materials were powder of $Y_2O_3$, $Bi_2O_3$, $\alpha$-$Fe_2O_3$ and $R_2O_3$ where R is one selected from La, Nd, Sm, Eu, Gd, Tb and Gy. The powder had a purity of 99.9% or more. We weighed 300 g of the powder, adjusting the final molar ratio of (Y+Bi+R):$Fe_2O_3$ in the sintered body to 3:4.95, and the molar ratio of Y:Bi:R to the ratios indicated in Tables 14-1 through 14-8. Each experimental powder was mixed in a ball mill, the powder was calcined at 700° C. for 2 h, and the powder was ground in a ball mill. The calcined powder was molded in a predetermined shape of 12 mm in diameter and 3 mm in thickness. The molded powder was sintered for 10 h at a temperature from 750° to 1450° C. at intervals of 50° C. The lowest sintering temperatures giving a relative density of 90% or more were determined. Further, the sintered bodies were ground, and single garnet phase was identified by X-ray diffraction. Tables 14-1 through 14-8 also show the results of this identification.

TABLE 14-1

| No. | Composition | | | XRD | Ts (°C.) |
|---|---|---|---|---|---|
| | Y | Bi | R | | |
| 111# | 3.0 | 0.0 | 0.0 | o | 1350 |

Ts: Lowest Sintering Temperature

TABLE 14-2

| No. | Composition | | | XRD | Ts (°C.) |
|---|---|---|---|---|---|
| | Y | Bi | R = La | | |
| 112 | 1.3 | 1.6 | 0.1 | o | 900 |
| 113 | 1.1 | 1.7 | 0.2 | o | 900 |
| 114 | 0.9 | 1.8 | 0.3 | o | 900 |
| 115 | 0.6 | 2.0 | 0.4 | o | 850 |
| 116# | 0.5 | 2.1 | 0.4 | x | 850 |
| 117# | 0.4 | 2.1 | 0.5 | x | 850 |

Ts: Lowest Sintering Temperature

TABLE 14-3

| No. | Composition | | | XRD | Ts (°C.) |
|---|---|---|---|---|---|
| | Y | Bi | R = Nd | | |
| 118 | 1.3 | 1.6 | 0.1 | o | 900 |
| 119 | 0.8 | 1.9 | 0.3 | o | 900 |
| 120 | 0.3 | 2.1 | 0.6 | o | 850 |
| 121# | 0.2 | 2.2 | 0.6 | x | 850 |
| 122# | 0.2 | 2.1 | 0.7 | x | 850 |

Ts: Lowest Sintering Temperature

TABLE 14-4

| No. | Composition | | | XRD | Ts (°C.) |
|---|---|---|---|---|---|
| | Y | Bi | R = Sm | | |
| 123 | 1.2 | 1.6 | 0.2 | o | 900 |
| 124 | 0.8 | 1.8 | 0.4 | o | 900 |
| 125 | 0.0 | 2.1 | 0.9 | o | 850 |
| 126# | 0.0 | 2.2 | 0.8 | x | 850 |

Ts: Lowest Sintering Temperature

TABLE 14-5

| No. | Composition | | | XRD | Ts (°C.) |
|---|---|---|---|---|---|
| | Y | Bi | R = Eu | | |
| 127 | 0.9 | 1.7 | 0.4 | o | 900 |

Ts: Lowest Sintering Temperature

TABLE 14-6

| No. | Composition | | | XRD | Ts (°C.) |
|---|---|---|---|---|---|
| | Y | Bi | R = Gd | | |
| 128 | 0.8 | 1.7 | 0.5 | o | 900 |
| 129 | 0.0 | 2.0 | 1.0 | o | 850 |

Ts: Lowest Sintering Temperature

TABLE 14-7

| No. | Composition | | | XRD | Ts (°C.) |
|---|---|---|---|---|---|
| | Y | Bi | R = Tb | | |
| 130 | 0.3 | 1.7 | 1.0 | o | 900 |

Ts: Lowest Sintering Temperature

TABLE 14-8

| No. | Composition | | | XRD | Ts (°C.) |
|---|---|---|---|---|---|
| | Y | Bi | R = Dy | | |
| 131 | 0.4 | 1.6 | 1.0 | o | 900 |

Ts: Lowest Sintering Temperature

In Tables 14-1 through 14-8, samples identified by X-ray diffraction as having single phase are indicated by O, and samples having no single phase are indicated by x. In the magnetic materials of samples Nos. 112–117 in Table 14-2, larger amounts of Bi formed a solid solution with increasing substitution amounts of La for Y. Bi in an amount of at most 2.1 molar parts was confirmed to form a solid solution with 0.4 molar part of La. The sintering temperature was reduced, compared to samples in which Y was not substituted by La and the molar part of Bi was 1.5. In sample Nos. 118–131 comprising other rare earth elements, Bi in an amount of 1.5 molar parts or more was confirmed to form a solid solution. Those samples were sintered at low temperature. When the La amount was 0.5 or more (sample No. 117 in Table 14-2) or the Nd amount was 0.7 or more (sample No. 122 in Table 14-3), the resulting garnet had no single phase.

Further, disks having a diameter of 25 mm and a thickness of 1.5 mm were placed above and below a Y-shaped strip line. The disks were prepared from the above calcined powder. Sr ferrite disks were placed to accommodate the disks therebetween. The sample was accommodated in a magnetic metal case. One end of the strip line was connected with a resistance for terminator, finalizing a distributed element type Y strip line isolator. The maximum isolation and the insertion loss at the frequency giving the maximum isolation were measured. As a result, the magnetic materials were found to have isolation of 20 dB or more, insertion loss of 0.5 dB or less and to be suitable for use in an isolator.

EXAMPLE 13

Starting materials were powder of $Y_2O_3$, $Bi_2O_3$, $La_2O_3$, $\alpha\text{-}Fe_2O_3$, $V_2O_5$, CuO, $MoO_3$, $WO_3$, PbO and $B_2O_3$. The powder had a purity of 99.9% or more. We weighed 300 g of the powder, adjusting the final molar ratio of Y:Bi:La:Fe in the sintered body to 1.3:1.6:0.1:4.95. As an additive, $V_2O_5$, CuO, $MoO_3$, $WO_3$, PbO or $B_2O_3$ was mixed in an amount of the weight parts indicated in Table 15, provided that 300 g of the weighed powder was 100 weight parts. Each experimental powder was mixed in a ball mill, the powder was calcined at 700° C. for 2 h, and the powder was ground in a ball mill. The calcined powder was molded in a predetermined shape of 12 mm in diameter and 3 mm in thickness. The molded powder was sintered for 10 h at a temperature from 750° to 1450° C. at intervals of 50° C. The lowest sintering temperatures giving a relative density of 90% or more were determined. Further, the sintered bodies were ground, and single garnet phase was identified by X-ray diffraction. Table 15 shows the results, indicating temperatures on the centigrade scale.

TABLE 15

| No. | Additive | Additive Amount (weight part) | | | | | | | | | |
|---|---|---|---|---|---|---|---|---|---|---|---|
| | | 0 | 0.02 | 0.05 | 0.1 | 0.2 | 0.5 | 1.0 | 2.0 | 5.0 | 7.0 |
| 132 | $V_2O_5$ | 900 | 850 | 850 | 800 | 800 | 800 | 800 | 800 | — | — |
| 133 | CuO | 900 | 850 | 850 | 800 | 800 | 800 | 800 | 800 | — | — |
| 134 | $MoO_3$ | 900 | 900 | 850 | 850 | 850 | 850 | 850 | 850 | — | — |
| 135 | $WO_3$ | 900 | 900 | 850 | 850 | 850 | 850 | 850 | 850 | — | — |
| 136 | PbO | 900 | 900 | 900 | 850 | 850 | 850 | 850 | 850 | — | — |
| 137 | $B_2O_3$ | 900 | — | — | 900 | 850 | 800 | 800 | 800 | 800 | 800 |

As can be seen from Tables 15, the magnetic materials comprising any of $V_2O_5$, CuO, $MoO_3$, $WO_3$, PbO and $B_2O_3$ were densified at much lower temperatures. When any of $V_2O_5$, CuO, $MoO_3$, $WO_3$ and PbO was added in an amount of 2.0 weight parts or more, single garnet phase was not formed, and secondary phase appeared. When $B_2O_3$ was added in an amount of 7.0 weight parts or more, single garnet phase was not formed, and secondary phase appeared. The samples comprising $V_2O_5$, CuO or $B_2O_3$ were sintered at 800° C. The adding after sintering had the same effects as the adding before sintering.

Further, disks having a diameter of 25 mm and a thickness of 1.5 mm were placed above and below Y-shaped strip line. The disks were prepared from the above calcined powder. Sr ferrite disks were placed to accommodate the disks therebetween. The sample was accommodated in a magnetic metal case. One end of the strip line was connected with a resistance for terminator, finalizing a distributed element type Y strip line isolator. The maximum isolation and the insertion loss at the frequency giving the maximum isolation were measured. As a result, the magnetic materials were found to have an isolation of 20 dB or more, an insertion loss of 0.5 dB or less and to be suitable for isolator.

EXAMPLE 14

Starting materials were powder of $Y_2O_3$, $Bi_2O_3$, $In_2O_3$ and $\alpha\text{-}Fe_2O_3$. The powder had a purity of 99.9% or more. We weighed of the powder, adjusting the final molar ratio of (Y+Bi):(Fe+In) in the sintered body to 3:4.95, and the molar ratio of Y:Bi:Fe:In to the values indicated in Table 16. Each experimental powder was mixed in a ball mill, the powder was calcined at 700° C. for 2 h, and the powder was ground in a ball mill. The calcined powder was molded in a predetermined shape of 12 mm in diameter and 3 mm in thickness. The molded powder was sintered for 10 h at a temperature from 750° to 1450° C. at intervals of 50° C. The lowest sintering temperatures giving a relative density of 90% or more were determined. Further, the sintered bodies were ground, and single garnet phase was identified by X-ray diffraction. Table 16 also shows the results of the identification.

TABLE 16

| | Composition | | | | | Ts |
|---|---|---|---|---|---|---|
| No. | Y | Bi | Fe | In | XRD | (°C.) |
| 138* | 3.0 | 0.0 | 4.95 | 0.0 | O | 1350 |
| 139* | 2.0 | 1.0 | 4.95 | 0.0 | O | 950 |
| 140* | 1.5 | 1.5 | 4.95 | 0.0 | O | 950 |
| 141* | 1.4 | 1.6 | 4.95 | 0.0 | X | 900 |
| 142 | 1.4 | 1.6 | 4.85 | 0.1 | O | 900 |
| 143 | 1.3 | 1.7 | 4.75 | 0.2 | O | 900 |

TABLE 16-continued

| | Composition | | | | | Ts |
|---|---|---|---|---|---|---|
| No. | Y | Bi | Fe | In | XRD | (°C.) |
| 144 | 1.2 | 1.8 | 4.65 | 0.3 | O | 900 |
| 145* | 1.1 | 1.9 | 4.65 | 0.3 | X | 900 |
| 146 | 1.0 | 2.0 | 4.55 | 0.4 | O | 850 |
| 147* | 0.9 | 2.1 | 4.55 | 0.4 | X | 850 |
| 148* | 0.9 | 2.1 | 4.45 | 0.5 | X | 850 |

Ts: Lowest Sintering Temperature

In Table 16, samples identified by X-ray diffraction as having single phase are indicated by O, and samples having no single phase are indicated by x. When Y was substituted by Bi, sample Nos. 138–141 comprising no In were sintered at low temperatures. When the amount of Bi was above 1.5 to reduce sintering temperature, no single phase was obtained, and secondary phase appeared. On the other hand, in the magnetic materials of sample Nos. 142–147, larger amounts of Bi formed a solid solution with increasing substitution amounts of In for Fe. Bi in an amount of at most 2.0 molar parts with In in an amount of 0.4 molar part was confirmed to form a solid solution. The sintering temperature was reduced, compared to samples in which Fe was not substituted by In and the amount of Bi was 1.5. When In was in an amount of 0.5 or more (sample No. 148), no garnet single phase was obtained.

Further, disks having a diameter of 25 mm and a thickness of 1.5 mm were placed above and below Y-shaped strip line. The disks were prepared from the above calcined powder. Sr ferrite disks were placed to accommodate the disks therebetween. The sample was accommodated in a magnetic metal case. One end of the strip line was connected with a resistance for terminator, finalizing a distributed element type Y strip line isolator. The maximum isolation and the insertion loss at the frequency giving the maximum isolation were measured. As a result, the magnetic materials were found to have an isolation of 20 dB or more, an insertion loss of 0.5 dB or less and to be suitable for isolator.

EXAMPLE 15

Starting materials were powder of $Y_2O_3$, $Bi_2O_3$, $In_2O_3$, $\alpha\text{-}Fe_2O_3$, $V_2O_5$, CuO, $MoO_3$, $WO_3$, PbO and $B_2O_3$. The powder had a purity of 99.9% or more. We weighed 300 g of the powder, adjusting the final molar ratio of Y:Bi:Fe:In in the sintered body to 1.2:1.8:4.65:0.3. As an additive, $V_2O_5$, CuO, $MoO_3$, $WO_3$, PbO or $B_2O_3$ was mixed in an amount of the weight parts indicated in Table 17, provided that 300 g of the weighed powder was 100 weight parts. Each experimental powder was mixed in a ball mill, the powder was calcined at 700° C. for 2 h, and the powder was ground in a ball mill. The calcined powder was molded in a predetermined shape being 12 mm in diameter and 3 mm in thickness. The molded powder was sintered for 10 h at a temperature from 750° to 1450° C. at intervals of 50° C. The lowest sintering temperatures giving a relative density of 90% or more were determined. Further, the sintered bodies were ground, and single garnet phase was identified by X-ray diffraction. Table 17 shows the results, indicating temperatures on the centigrade scale.

TABLE 17

| No. | Additive | \multicolumn{10}{c}{Additive Amount (weight part)} | | | | | | | | | |
|-----|----------|---|------|------|-----|-----|-----|-----|-----|-----|-----|
|     |          | 0 | 0.02 | 0.05 | 0.1 | 0.2 | 0.5 | 1.0 | 2.0 | 5.0 | 7.0 |
| 149 | $V_2O_5$ | 900 | 850 | 850 | 800 | 800 | 800 | 800 | 800 | —   | —   |
| 150 | CuO      | 900 | 850 | 850 | 800 | 800 | 800 | 800 | 800 | —   | —   |
| 151 | $MoO_3$  | 900 | 900 | 850 | 850 | 850 | 850 | 850 | 850 | —   | —   |
| 152 | $WO_3$   | 900 | 900 | 850 | 850 | 850 | 850 | 850 | 850 | —   | —   |
| 153 | PbO      | 900 | 900 | 900 | 850 | 850 | 850 | 850 | 850 | —   | —   |
| 154 | $B_2O_3$ | 900 | —   | —   | 900 | 850 | 800 | 800 | 800 | 800 | 800 |

As can be seen from Tables 17, the magnetic materials comprising any of $V_2O_5$, CuO, $MoO_3$, $WO_3$, PbO and $B_2O_3$ were densified at much lower temperatures. When any of $V_2O_5$, CuO, $MoO_3$, $NO_3$ and PbO was added in an amount of 2.0 weight parts or more, single garnet phase was not formed, and secondary phase appeared. When $B_2O_3$ was added in an amount of 7.0 weight parts or more, single garnet phase was not formed, and secondary phase appeared. The samples comprising $V_2O_5$, CuO or $B_2O_3$ were sintered at 800° C. The adding after sintering had the same effects as the adding before sintering.

Further, disks having a diameter of 25 mm and a thickness of 1.5 mm were placed above and below Y-shaped strip line. The disks were prepared from the above calcined powder. Sr ferrite disks were placed to accommodate the disks therebetween. The sample was accommodated in a magnetic metal case. One end of the strip line was connected with a resistance for terminator, finalizing a distributed element type Y strip line isolator. The maximum isolation and the insertion loss at the frequency giving the maximum isolation were measured. As a result, the magnetic materials were found to have isolation of 20 dB or more, insertion loss of 0.5 dB or less and to be suitable for isolator.

EXAMPLE 16

In the same manner as in Example 13, we weighed 300 g of the powder, adjusting the final molar ratio of Y:Bi:La:Fe in the sintered body to 1.3:1.6:0.1:4.95. As an additive, $V_2O_5$ (0.3 g) was mixed therewith. The weighed powder was mixed in a ball mill, and then calcined at 700° C. for 2 h. The calcined powder was ground in a ball mill, and then mixed with an organic binder comprising polyvinyl butyral ("ESUDEKKU BM-S", Sekisui Chemical Co., Ltd.). A 400 μm-thick green sheet was formed by the doctor blade process, and the sheet was cut into a circle. On the other hand, a conducting paste comprising Ag and vehicle was prepared. The paste was printed as strip lines on the green sheet. Another green sheet was placed above. Pressure of 300–500 kg/cm² was applied in the thickness direction to press the green sheets into contact, finalizing a green-sheet laminate having magnetic materials and electrodes disposed therebetween. The laminate was 3.5 mm in diameter and 0.5 mm in thickness. The laminate was sintered at 920° C. for 3 h. The resulting inductor was found to have an L value of 200 nH and a Q value of 30 at 100 MHz.

Inductors prepared by substituting another rare earth element for La exhibited the same results. An inductor similarly prepared by adjusting the final molar ratio of Y:Bi:Fe:In in the sintered body to 1.2:1.8:4.65:0.3 also exhibited the same results.

EXAMPLE 17

In the same manner as in Example 13, we weighed 300 g of the powder, adjusting the final molar ratio of Y:Bi:La:Fe in the sintered body to 1.3:1.6:0.1:4.95. $V_2O_5$ (0.3 g) was added to the powder. The weighed powder was mixed in a ball mill. The powder was calcined at 700° C. for 2 h, and then ground in a ball mill. The calcined powder was mixed with an organic binder comprising polyvinyl butyral ("ESUDEKKU BM-S", Sekisui Chemical Co., Ltd.). A 400 μm-thick green sheet was formed by the reverse roll coater process, and the sheet was cut into a circle. On the other hand, a conducting paste comprising Ag and vehicle was prepared. The paste was printed as strip lines on the green sheet. Three identical samples were prepared. The three were piled up so that every two adjacent strip lines cross at 120°. Another green sheet was placed above. Pressure of 300–500 kg/cm² was applied in the thickness direction to press the green sheets into contact, finalizing a green-sheet laminate having 4 layers of magnetic materials and 3 layers of electrodes disposed therebetween. The laminate was 3.5 mm in diameter and 0.5 mm in thickness. The laminate was sintered at a temperature indicated in Table 18 for 3 h to form a closed magnetic patch. Ag paste was applied at 6 points on the side of the sintered body at the level of the inner conductor. The Ag paste was burned at 700° C. for 10 min to form outer conductors. Among the 6 electrodes, three electrodes spaced at angles of 120° were grounded. Another electrode was grounded through a matching resistance to terminate. At the rest of the electrodes, a terminal and a load were disposed. Further, Sr ferrite disks were placed to accommodate the disks therebetween. The sample was accommodated in a magnetic metal case, finalizing a lumped element type isolator for 1.9 GHz. The isolator was 7 millimeters long, 7 millimeters wide and 2.3 millimeters thick.

For comparison, lumped element type isolators were similarly formed in a composition and materials indicated in Table 18. Conventional lumped element type isolators having an open magnetic patch were also formed. In those cases, magnetic material and electrodes were placed independently. The size of the magnetic material used was 5 mm diameter and 0.5 mm thick in the closed-magnetic-patch isolators and the conventional isolators. The isolation relative band width for the resulting isolators and the insertion loss were measured. The isolation relative band width here refers to a ratio of frequency band width giving isolation of 20 dB or more to maximum isolation frequency. Table 18 also shows the results of the measurements.

TABLE 18

| No. | Magnetic Patch | Composition | | | | Ts (°C.) | RBW (%) | IL (dB) |
|---|---|---|---|---|---|---|---|---|
| | | Y | Bi | La | E | | | |
| 155 | Closed | 1.3 | 1.6 | 0.1 | Ag | 900 | 6 | 0.55 |
| 156* | Closed | 1.3 | 1.6 | 0.1 | Pd | 900 | 6 | 1.1 |
| 157* | Closed | 3.0 | 0.0 | 0.0 | Ag | 900 | — | — |
| 158* | Closed | 3.0 | 0.0 | 0.0 | Pd | 1400 | 8 | 1.0 |
| 159* | Open | 3.0 | 0.0 | 0.0 | Ag | 1400 | 4 | 0.7 |

E: Electrode
Ts: Sintering Temperature
RBW: Relative Bandwidth
IL: Insertion Loss As can be seen from Table 18, samples having a closed magnetic patch had a wide relative band width. The magnetic materials comprising Bi and La together with an inner electrode of Ag were sintered at 900° C. to form a closed magnetic patch. As a result, wide relative band width and low insertion loss were obtained. When samples contained Bi but not La, the samples exhibited a rather large insertion loss. It is thought that the samples not containing La were not fully densified by sintering at 900° C., and increased insertion loss. When the samples contained Bi and Ag was replaced as electrodes with Pd, Ag-Pd alloy or $RuO_2$, the samples also exhibited rather large insertion loss. It is thought that non-Ag electrodes had large electric resistance.

In the cases of conventional YIG not containing Bi or La, no isolators were formed when the Ag inner electrode was sintered at the same time to form a closed magnetic patch. This is possibly because YIG was not fully densified at low temperatures and when YIG was densified at high temperatures, which considerably exceeds the melting point of Ag, electrodes were broken. In this case, sintering an inner electrode of Pd at 1400° C. resulted in good isolators. However, there were some problems; Pd was expensive, high temperatures were needed for sintering, and the insertion loss was rather large.

Isolators prepared by substituting another rare earth element for La exhibited similar results. An isolator similarly prepared by adjusting the final molar ratio of Y:Bi:Fe:In in the sintered body to 1.2:1.8:4.65:0.3 also exhibited similar results.

EXAMPLE 18

Starting materials were 99.9-purity powder of $Y_2O_3$, $Bi_2O_3$, $\alpha$-$Fe_2O_3$ and $V_2O_5$. We weighed 300 g of the powder, adjusting the amount of $Fe_2O_3$, $Bi_2O_3$ and $Y_2O_3$ to the values referred to as x, y and 3-y indicated in Table 19, respectively. As an additive, $V_2O_5$ (0.3 g) was added thereto. Each experimental powder was mixed in a ball mill, the powder was calcined at 850° C. for 2 h, and the calcined powder was ground in a ball mill. The calcined powder was molded in a predetermined shape of 12 mm in diameter and 3 mm in thickness. The powder was sintered for 3 h at a temperature from 750° to 1450° C. at intervals of 50° C. The relative density of the samples was measured. The lowest sintering temperatures giving a relative density of 90% or more were determined. The presence of secondary phase was detected by X-ray diffraction. Table 19 shows the results, indicating temperatures on the centigrade scale and the presence or absence of secondary phase by P or A.

TABLE 19

| No. | Bi y | Fe amount x ($Y_{3-y}Bi_yFe_xO_{12}$) | | | | | | | |
|---|---|---|---|---|---|---|---|---|---|
| | | 4.70 | 4.76 | 4.82 | 4.88 | 4.94 | 4.98 | 5.00 | 5.02 |
| 160 | 0 | 1350 /P | 1350 /A | 1350 /A | 1350 /A | 1350 /A | 1350 /A | 1350 /A | 1350 /P |
| 161 | 0.5 | 1150 /P | 1150 /A | 1150 /A | 1150 /A | 1150 /A | 1150 /A | 1150 /A | 1150 /P |
| 162 | 0.7 | 1050 /P | 1050 /A | 1050 /A | 1050 /A | 1050 /A | 1050 /A | 1050 /A | 1050 /P |
| 163 | 1.0 | 950 /P | 950 /A | 950 /A | 950 /A | 950 /A | 950 /A | 950 /A | 950 /P |
| 164 | 1.5 | 950 /P | 950 /A | 950 /A | 950 /A | 950 /A | 950 /A | 950 /A | 950 /P |
| 165 | 2.0 | 850 /P | 850 /P | 850 /P | 850 /P | 850 /P | 850 /P | 850 /P | 850 /P |

P: Presence
A: Absence

As can be seen from Table 19, the samples were sintered at lower temperatures with increasing y. However, when y was 2.0 or more, garnet single phase was not obtained, and secondary phase was recognized. When x was 4.7 or less, or above 5.00, garnet single phase was not obtained, and secondary phase was recognized. When x was 5.00, garnet single phase was obtained. When Fe deviated down from the stoichiometry composite $Y_3Fe_5O_{12}$, samples having good crystallinity were obtained. The adding after calcination had the same effects as the adding before sintering.

EXAMPLE 19

Starting materials were 99.9-purity powder of $Y_2O_3$, $\alpha$-$Fe_2O_3$, $V_2O_5$ and CuO. We weighed 300 g of the powder, adjusting the molar ratio of $Y_2O_3$:$Fe_2O_3$ to 3:x in Tables 20 and 21. As an additive, $V_2O_5$ or CuO was mixed in an amount of the weight parts indicated in Table 20 or 21. Each experimental powder was mixed in a ball mill, the powder was calcined at 1100° C. for 2 h, and the calcined powder was ground in a ball mill. The calcined powder was molded in a predetermined shape of 12 mm in diameter and 3 mm in thickness. The molded powder was sintered for 3 h at a temperature from 750° to 1450° C. at intervals of 50° C. The relative density of the samples was measured. The lowest sintering temperatures giving a relative density of 90% or more were determined. The presence of secondary phase was detected by X-ray diffraction. Tables 20 and 21 also show the results, indicating temperatures on the centigrade scale and the presence or absence of secondary phase by P or A.

TABLE 20

| No. | $V_2O_5$ z | Fe amount x ($Y_3Fe_xO_{12}$ + z weight part $V_2O_5$) | | | | | | | |
|---|---|---|---|---|---|---|---|---|---|
| | | 4.70 | 4.76 | 4.82 | 4.88 | 4.94 | 4.98 | 5.00 | 5.02 |
| 166 | 0 | 1350 /P | 1350 /A | 1350 /A | 1350 /A | 1350 /A | 1350 /A | 1350 /A | 1350 /P |
| 167 | 0.02 | 1250 /P | 1250 /A | 1250 /A | 1250 /A | 1250 /A | 1250 /A | 1250 /A | 1250 /P |
| 168 | 0.05 | 1250 /P | 1250 /A | 1250 /A | 1250 /A | 1250 /A | 1250 /A | 1250 /A | 1250 /P |
| 169 | 0.1 | 1250 /P | 1250 /A | 1250 /A | 1250 /A | 1250 /A | 1250 /A | 1250 /A | 1250 /P |
| 170 | 0.2 | 1250 /P | 1250 /A | 1250 /A | 1250 /A | 1250 /A | 1250 /A | 1250 /A | 1250 /P |

TABLE 20-continued

| No. | $V_2O_5$ z | Fe amount x ($Y_3Fe_5O_{12}$ + z weight part $V_2O_4$) | | | | | | | |
|---|---|---|---|---|---|---|---|---|---|
| | | 4.70 | 4.76 | 4.82 | 4.88 | 4.94 | 4.98 | 5.00 | 5.02 |
| 171 | 0.5 | 1200/P | 1200/A | 1200/A | 1200/A | 1200/A | 1200/A | 1200/A | 1200/P |
| 172 | 1.0 | 1200/P | 1200/A | 1200/A | 1200/A | 1200/A | 1200/A | 1200/A | 1200/P |
| 173 | 2.0 | 1200/P | 1200/P | 1200/P | 1200/P | 1200/P | 1200/P | 1200/P | 1200/P |

P: Presence
A: Absence

TABLE 21

| No. | CuO z | Fe amount x ($Y_3Fe_5O_{12}$ + z weight part CuO) | | | | | | | |
|---|---|---|---|---|---|---|---|---|---|
| | | 4.70 | 4.76 | 4.82 | 4.88 | 4.94 | 4.98 | 5.00 | 5.02 |
| 174 | 0 | 1350/P | 1350/A | 1350/A | 1350/A | 1350/A | 1350/A | 1350/A | 1350/P |
| 175 | 0.02 | 1250/P | 1250/A | 1250/A | 1250/A | 1250/A | 1250/A | 1250/A | 1250/P |
| 176 | 0.05 | 1250/P | 1250/A | 1250/A | 1250/A | 1250/A | 1250/A | 1250/A | 1250/P |
| 177 | 0.1 | 1250/P | 1250/A | 1250/A | 1250/A | 1250/A | 1250/A | 1250/A | 1250/P |
| 178 | 0.2 | 1250/P | 1250/A | 1250/A | 1250/A | 1250/A | 1250/A | 1250/A | 1250/P |
| 179 | 0.5 | 1200/P | 1200/A | 1200/A | 1200/A | 1200/A | 1200/A | 1200/A | 1200/P |
| 180 | 1.0 | 1200/P | 1200/A | 1200/A | 1200/A | 1200/A | 1200/A | 1200/A | 1200/P |
| 181 | 2.0 | 1200/P | 1200/P | 1200/P | 1200/P | 1200/P | 1200/P | 1200/P | 1200/P |

P: Presence
A: Absence

As can be seen from Tables 20 and 21, the samples were sintered at lower temperatures with increasing z. However, when z was 2.0 or more, garnet single phase was not obtained, and secondary phase was recognized. When x was 4.7 or less, or above 5.00, garnet single phase was not obtained, and secondary phase was recognized. When x was 5.00, garnet single phase was obtained. When Fe deviated down from the stoichiometry composite $Y_3Fe_5O_{12}$, samples having good crystallinity were obtained. The adding after calcination had the same effects as the adding before sintering.

EXAMPLE 20

Starting materials were 99.9-purity powder of $Y_2O_3$, $Bi_2O_3$, $\alpha$-$Fe_2O_3$, $V_2O_5$, CuO, $MoO_3$, $WO_3$ and PbO. We weighed 300 g of the powder, adjusting the molar ratio of $Y_2O_3$:$Fe_2O_3$ to 3:x in Table 22. As an additive, $V_2O_5$, CuO, $MoO_3$, $WO_3$ or PbO (0.38) was mixed therewith. Each experimental powder was mixed in a ball mill, the powder was calcined at 850° C. for 2 h, and the calcined powder was ground in a ball mill. The calcined powder was molded in a predetermined shape of 12 mm in diameter and 3 mm in thickness. The powder was sintered for 3 h at a temperature from 750° to 1450° C. at intervals of 50° C. The relative density of samples was measured. The lowest sintering temperatures giving a relative density of 90% or more were determined. The presence of secondary phase was detected by X-ray diffraction. Table 22 also shows the results, indicating temperatures on the centigrade scale and the presence or absence of secondary phase by P or A.

TABLE 22

| No. | Additive | Fe amount x ($Y_3Fe_5O_{12}$ + 0.1 weight part additive) | | | | | | | |
|---|---|---|---|---|---|---|---|---|---|
| | | 4.70 | 4.76 | 4.82 | 4.88 | 4.94 | 4.98 | 5.00 | 5.02 |
| 182 | $V_2O_5$ | 1250/P | 1250/A | 1250/A | 1250/A | 1250/A | 1250/A | 1250/A | 1250/P |
| 183 | CuO | 1250/P | 1250/A | 1250/A | 1250/A | 1250/A | 1250/A | 1250/A | 1250/P |
| 184 | $MoO_3$ | 1250/P | 1250/A | 1250/A | 1250/A | 1250/A | 1250/A | 1250/A | 1250/P |
| 185 | $WO_3$ | 1300/P | 1300/A | 1300/A | 1300/A | 1300/A | 1300/A | 1300/A | 1300/P |
| 186 | PbO | 1300/P | 1300/A | 1300/A | 1300/A | 1300/A | 1300/A | 1300/A | 1300/P |

P: Presence
A: Absence

As can be seen from Table 22, the samples comprising any of $V_2O_5$, CuO, $MoO_3$, $WO_3$ and PbO in the same amount were sintered at the constant temperatures, independently of the amount of $Fe_2O_3$. However, when z was 4.7 or less, or above 5.00, garnet single phase was not obtained, and secondary phase was recognized. When x was 5.00, garnet single phase was obtained. When Fe deviated down from the stoichiometry composite $Y_3Fe_5O_{12}$, samples having good crystallinity were obtained. The addition of $V_2O_5$ or CuO was effective for densification in sintering at low temperatures. The adding after calcination had the same effects as the adding before sintering.

EXAMPLE 21

Starting materials were 99.9-purity powder of $Y_2O_3$, $Bi_2O_3$, $\alpha$-$Fe_2O_3$ and $V_2O_5$. We weighed 300 g of the powder, adjusting the final molar ratio of ($Y_2O_3$+$Bi_2O_3$):$Fe_2O_3$ in the sintered body to 3:4.88, and the molar ratio of Y:Bi to 2:1. $V_2O_5$ (0.3 g) was added thereto. The weighed powder was mixed in a ball mill, and then calcined at 850° C. for 2 h. The calcined powder was ground in a ball mill, and then molded in a predetermined shape. The molded powder was sintered at 900° C. for 3 h, giving a disk of magnetic garnet having a diameter of 25 mm and a thickness of 1.5 mm. The disks were placed above and below Y-shaped strip line. Further, Sr ferrite disks were placed to accommodate the disks therebetween. The sample was accommodated in a magnetic metal case. One end of the strip line was connected with a resistance for terminator, finalizing a distributed element type Y strip line isolator. The insertion loss for the samples at 1 GHz was found to be 0.28 dB. For comparison, an isolator was formed under the condition of $Fe_2O_3$=5.00. The isolator was found to have an insertion loss of 0.35 dB.

The magnetic materials of the invention in which the amount of Fe was precisely controlled were densified at much lower temperatures, compared to conventional sintered bodies. Specifically, the samples were sintered at 900° C. or less. Samples exhibited an insertion loss of 0.5 dB or less. The samples were found to be suitable for isolators.

EXAMPLE 22

In the same manner as in Example 18, we weighed 300 g of the powder, adjusting the molar ratio of $Y_2O_3$:$Bi_2O_3$:$Fe_2O_3$ to 2:1:4.88. As an additive, CuO (0.3 g) was mixed therewith. The weighed powder was mixed in a ball mill, the powder was calcined at 850° C. for 5 h, and the powder was ground in a ball mill. The calcined powder was mixed with an organic binder comprising polyvinyl butyral ("ESUDEKKU BM-S", Sekisui Chemical Co., Ltd.). A 400

μm-thick green sheet was formed by the reverse roll coater process, and the sheet was cut into a circle. On the other hand, a conducting paste comprising Ag and ethylcellulose-based vehicle was prepared using 80 wt % of Ag powder and 20 wt % of ethylcellulose and 2-(2-n-butoxyethoxy) ethylacetate. The paste was printed as strip lines on the green sheet. Three identical samples were prepared. The three were piled up so that every two adjacent strip lines cross at 120°. Another green sheet was placed above. Pressure of 300–500 kg/cm² was applied in the thickness direction to press the green sheets into contact, finalizing a green-sheet laminate having 4 layers of magnetic materials and 3 layers of electrodes disposed therebetween. The laminate was 3.5 mm in diameter and 0.5 mm in thickness. The laminate was sintered at 900° C. for 3 h to form a closed magnetic patch. Ag paste was applied at 6 points on the side of the sintered body at the level of the inner conductor. The Ag paste was burned at 700° C. for 10 min to form outer conductors. Among the 6 electrodes, three electrodes spaced at angles of 120° were grounded. Another electrode was grounded through a matching resistance to terminate. At the rest of the electrodes, a terminal and a load were disposed. Further, magnet disks were placed to accommodate the disks therebetween. The sample was accommodated in a magnetic metal case, finalizing a lumped element type isolator for 1.9 GHz. The isolator was 7 millimeters long, 7 millimeters wide and 2.3 millimeters thick.

For comparison, lumped element type isolators were similarly formed in a condition indicated in Table 23. Conventional lumped element type isolators having open magnetic patch were also formed. In those cases, magnetic material and electrodes were placed independently. The size of the magnetic material used was 5 mm diameter and 0.5 mm thick in the isolators and the conventional isolators. The isolation relative band width for the resulting isolators and the insertion loss were measured. The isolation relative band width here refers to a ratio of frequency band width giving isolation of 20 dB or more to maximum isolation frequency. Table 23 also shows the results of the measurements.

TABLE 23

| No. | Magnetic Patch | E | Composition Y/Bi/Fe | Additive | Ts (°C.) | RBW (%) | IL (dB) |
|---|---|---|---|---|---|---|---|
| 187* | Closed | Ag | 2.0/1.0/5.0 | 0 | 900 | 6 | 0.8 |
| 188* | Closed | Ag | 2.0/1.0/5.0 | 0.1 weight part V₂O₅ | 900 | 6 | 0.65 |
| 189* | Closed | Ag | 2.0/1.0/5.0 | 0.1 weight part CuO | 900 | 6 | 0.65 |
| 190 | Closed | Ag | 2.0/1.0/4.88 | 0.1 weight part V₂O₅ | 900 | 6 | 0.6 |
| 191 | Closed | Ag | 2.0/1.0/4.88 | 0.1 weight part CuO | 900 | 6 | 0.6 |
| 192 | Closed | Ag | 2.0/1.0/4.82 | 0.1 weight part V₂O₅ | 900 | 6 | 0.62 |
| 193 | Closed | Ag | 2.0/1.0/4.94 | 0.1 weight part CuO | 900 | 6 | 0.62 |
| 194 | Closed | Ag | 2.0/1.0/4.76 | 0.1 weight part V₂O₅ | 900 | 6 | 0.64 |
| 195* | Closed | Ag | 2.0/1.0/4.70 | 0.1 weight part CuO | 900 | 6 | 0.75 |
| 196 | Closed | Ag | 2.0/1.0/4.98 | 0.1 weight part V₂O₅ | 900 | 6 | 0.64 |
| 197* | Closed | Ag | 2.0/1.0/5.02 | 0.1 weight part V₂O₅ | 900 | 6 | 0.77 |
| 198* | Closed | Pd | 2.0/1.0/5.0 | 0.1 weight part V₂O₅ | 900 | 6 | 1.1 |
| 199* | Closed | Ag | 3.0/0/5.0 | 0 | 900 | — | — |

TABLE 23-continued

| No. | Magnetic Patch | E | Composition Y/Bi/Fe | Additive | Ts (°C.) | RBW (%) | IL (dB) |
|---|---|---|---|---|---|---|---|
| 200* | Closed | Pd | 3.0/0/5.0 | 0 | 1400 | 8 | 1.0 |
| 201* | Open | Ag | 3.0/0/5.0 | 0 | 1400 | 4 | 0.7 |

Examples marked with * are comparative examples.
E: Electrode
Ts: Sintering Temperature
RBW: Relative Bandwidth
IL: Insertion Loss As can be seen from Table 23, the samples having a closed magnetic patch had a wide relative band width. The magnetic materials of the invention comprising Bi, any of V₂O₅ and CuO, and Fe of which the amount was precisely controlled, were sintered at 900° C. Consequently, an inner electrode of Ag was sintered at the same time to form a closed magnetic patch. As a result, wide relative band width and low insertion loss were obtained. When the amount of Fe was too much or too little, the samples had a rather large insertion loss, independently of the kind of additive or electrode materials. It is thought that the amount of Fe was too inappropriate to densify samples in sintering at 900° C., and increased insertion loss. When the amount of Fe was between 4.82 and 4.94, deviating down from the stoichiometry composite Y₃Fe₅O₁₂, the samples exhibited low insertion loss and excellent properties.

EXAMPLE 23

In the same manner as in Example 18, we weighed 300 g of the powder, adjusting the molar ratio of $Y_2O_3:Bi_2O_3:CaCO_3:Fe_2O_3:In_2O_3:V_2O_5$ to 0.8:1.4:0.8:4.18:0.3:0.4. The weighed powder was mixed in a ball mill, the powder was calcined at 850° C. for 5 h, and the powder was ground in a ball mill. With the calcined powder, a lumped element type isolator was formed in the same manner as in Example 22. The isolator was 7 millimeters long, 7 millimeters wide and 2.3 millimeters thick.

For comparison, lumped element type isolators were similarly formed in a composition and materials indicated in Table 24. The isolation relative band width for the resulting isolators and the insertion loss were measured. The isolation relative band width here refers to a ratio of frequency band width giving isolation of 20 dB or more to maximum isolation frequency. Table 24 also shows the results of the measurements.

TABLE 24

| No. | Magnetic Patch | E | Composition Y/Bi/Ca/Fe/In/V | Ts (°C.) | RBW (%) | IL (dB) |
|---|---|---|---|---|---|---|
| 202* | Closed | Ag | 0.8/1.4/0.8/4.3/0.3/0.4 | 900 | 6 | 0.65 |
| 203 | Closed | Ag | 0.8/1.4/0.8/4.27/0.3/0.4 | 900 | 6 | 0.60 |
| 204 | Closed | Ag | 0.8/1.4/0.8/4.24/0.3/0.4 | 900 | 6 | 0.54 |
| 205 | Closed | Ag | 0.8/1.4/0.8/4.18/0.3/0.4 | 900 | 6 | 0.5 |
| 206 | Closed | Ag | 0.8/1.4/0.8/4.12/0.3/0.4 | 900 | 6 | 0.56 |
| 207 | Closed | Ag | 0.8/1.4/0.8/4.05/0.3/0.4 | 900 | 6 | 0.62 |
| 208* | Closed | Ag | 0.8/1.4/0.8/4.0/0.3/0.4 | 900 | 6 | 0.75 |

Examples marked with * are comparative examples.
E: Electrode
Ts: Sintering Temperature
RBW: Relative Bandwidth
IL: Insertion Loss As can be seen from Table 24, the magnetic materials of the invention comprising Bi, Ca, In, V, and Fe of which the amount was precisely controlled, were sintered at 900° C.

Consequently, an inner electrode of Ag was sintered at the same time to form a closed magnetic patch. As a result, wide relative band width and low insertion loss were obtained. When the amount of Fe was too much or too little, the samples had rather large insertion loss. It is thought that the amount of Fe was too inappropriate to densify samples in sintering at 900° C., and increased insertion loss. When the amount of Fe was between 4.12 and 4.24, deviating down from the stoichiometry composite $Y_3Fe_5O_{12}$, the samples exhibited low insertion loss and excellent properties.

As explained above, the invention enables to readily produce magnetic garnet for high-frequency. Sintering at 900° C. or less is realized so that the magnetic material can be sintered with electrode materials or dielectric materials, providing circuit components having high performance and a smaller size.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

What is claimed is:

1. A sintered magnetic material for microwave, comprising a phase having garnet structure, said phase comprising a component represented by Formula I $$(A_{3-a}Bi_a)B_xO_y \qquad \text{Formula I}$$

where A represents a component comprising at least one element selected from yttrium (Y) and rare earth elements, B represents a component comprising Fe, a represents a number in the range of 0 to less than 2.00, x represents a number in the range of 4.76 to less than 5.00, and y represents a number satisfying an inequality $1.5(3+x) \leq y \leq 12$.

2. The sintered bulk magnetic material for microwave according to claim 1, wherein a in Formula I ranges from 0.5 to 1.5.

3. The sintered bulk magnetic material for microwave according to claim 1, wherein $(A_{3-a}Bi_a)$ in Formula I is $(Y_{3-a-z}Bi_aR_z)$, and said component is represented by Formula II $$(Y_{3-a-z}Bi_aR_z)B_xO_y \qquad \text{Formula II}$$

where R represents a rare earth element selected from the group consisting of La, Nd, Sm, Eu, Gd, Tb and Dy, B represents a component comprising Fe, a represents a number in the range of 0 to less than 2.00, x represents a number in the range of 4.76 to less than 5.00, y represents a number satisfying an inequality $1.5(3+x) \leq y \leq 12$, and when b is one number selected from among 0.1, 0.2, 0.4, 0.6, 0.8, 1.0 and 1.3, z represents a number satisfying inequalities $0 < a \leq 1.5+bz$ and $0 < a+z \leq 3$.

4. The sintered bulk magnetic material for microwave according to claim 3, wherein R in Formula II is La, b in Formula II is 1.3, and said component is represented by Formula III $$(Y_{3-a-z}Bi_aLa_z)B_xO_y \qquad \text{Formula III}$$

where B represents a component comprising Fe, a represents a number in the range of 0 to less than 2.00, x represents a number in the range of 4.76 to less than 5.00, z represents a number in the range of more than 0 to 0.4, and a and z satisfy inequalities $0 < a \leq 1.5+1.3z$ and $0 < a+z \leq 3$.

5. The sintered bulk magnetic material for microwave according to claim 3, wherein R in Formula II is Nd, b in Formula II is 1.0, and said component is represented by Formula IV $$(Y_{3-a-z}Bi_aNd_z)B_xO_y \qquad \text{Formula IV}$$

where B represents a component comprising Fe, a represents a number in the range of 0 to less than 2.00, x represents a number in the range of 4.76 to less than 5.00, y represents a number satisfying an inequality $1.5(3+x) \leq y \leq 12$, z represents a number in the range of more than 0 to 0.6, and a and z satisfy inequalities $0 < a \leq 1.5+1.0z$ and $0 < a+z \leq 3$.

6. The sintered bulk magnetic material for microwave according to claim 3, wherein R in Formula II is Sm, b in Formula II is 0.8, and said component is represented by Formula V $$(Y_{3-a-z}Bi_aSm_z)B_xO_y \qquad \text{Formula V}$$

where B represents a component comprising Fe, a represents a number in the range of 0 to less than 2.00, x represents a number in the range of 4.76 to less than 5.00, y represents a number satisfying an inequality $1.5(3+x) \leq y \leq 12$, z represents a number of more than 0, and a and z satisfy inequalities $0 < a \leq 1.5+0.8z$ and $0 < a+z \leq 3$.

7. The sintered bulk magnetic material for microwave according to claim 1, wherein R in Formula II is Eu, b in Formula II is 0.6, and said component is represented by Formula VI $$(Y_{3-a-z}Bi_aEu_z)B_xO_y \qquad \text{Formula VI}$$

where B represents a component comprising Fe, a represents a number in the range of 0 to less than 2.00, x represents a number in the range of 4.76 to less than 5.00, y represents a number satisfying an inequality $1.5(3+x) \leq y \leq 12$, z represents a number of more than 0, and a and z satisfy inequalities $0 < a \leq 1.5+0.6z$ and $0 < a+z \leq 3$.

8. The sintered bulk magnetic material for microwave according to claim 3, wherein R in Formula II is Gd, b in Formula II is 0.4, and said component is represented by Formula VII $$(Y_{3-a-z}Bi_aGd_z)B_xO_y \qquad \text{Formula VII}$$

where B represents a component comprising Fe, a represents a number in the range of 0 to less than 2, x represents a number in the range of 4.76 to less than 5.00, y represents a number satisfying an inequality $1.5(3+x) \leq y \leq 12$, z represents a number of more than 0, and a and z satisfy inequalities $0 < a \leq 1.5+0.4z$ and $0 < a+z \leq 3$.

9. The sintered bulk magnetic material for microwave according to claim 3, wherein R in Formula II is Tb, b in Formula II is 0.2, and said component is represented by Formula VIII $$(Y_{3-a-z}Bi_aTb_z)B_xO_y \qquad \text{Formula VIII}$$

where B represents a component comprising Fe, a represents a number in the range of 0 to less than 2.00, x represents a number in the range of 4.76 to less than 5.00, y represents a number satisfying an inequality $1.5(3+x) \leq y \leq 12$, z represents a number of more than 0, and a and z satisfy inequalities $0 < a \leq 1.5+0.2z$ and $0 < a+z \leq 3$.

10. The sintered bulk magnetic material for microwave according to claim 3, wherein R in Formula II is Dy, b in Formula II is 0.1, and said component is represented by Formula IX $$(Y_{3-a-c}Bi_aDy_c)B_xO_y \qquad \text{Formula IX}$$

where B represents a component comprising Fe, a represents a number in the range of 0 to less than 2.00, x represents a number in the range of 4.76 to less than 5.00, y represents a number satisfying an inequality $1.5(3+x) \leq y \leq 12$, z represents a number of more than 0, and a and z satisfy inequalities $0 < a \leq 1.5+0.1z$ and $0 < a+z \leq 3$.

11. The sintered bulk magnetic material for microwave according to claim 1, wherein A in Formula I is Y, B in Formula I is $(Fe_{1-c/x}In_{c/x})$, and said component is represented by Formula X $$Y_{3-a}Bi_a(Fe_{1-c/x}In_{c/x})_xO_y \qquad \text{Formula X}$$

a represents a number in the range of 0 to less than 2.00, c represents a number of more than 0 to less than 0.5, a and c satisfies an inequality $0 < a \leq 1.5+1.3c$, x represents a number in the range of 4.76 to less than 5.00, and y represents a number satisfying an inequality $1.5(3+x) \leq y \leq 12$.

12. A sintered, bulk magnetic material for microwave comprising a phase having garnet structure, said phase comprising a component represented by Formula XI $$(A_{3-a-b}Ca_bBi_a)(Fe_{1-c/x-d/x}In_{c/x}V_{d/x})_xO_y \qquad \text{Formula XI}$$

where a represents a number in the range of 0 to less than 2.00, b represents a number satisfying an inequality $0 < c+d \leq 5$, d represents a number satisfying an equation $d=b/2$, x represents a number in the range of 4.76 to less than 5.00, and y represents a number satisfying an inequality $1.5(3+x) \leq y \leq 12$.

13. The sintered bulk magnetic material for microwave according to claim 1, further comprising $V_2O_5$, wherein the material comprises 100 weight parts of the phase and from more than 0 to 1 weight part of $V_2O_5$.

14. The sintered bulk magnetic material for microwave according to claim 1, further comprising CuO, wherein the material comprises 100 weight parts of the phase and from more than 0 to 1 weight part of CuO.

15. The sintered bulk magnetic material for microwave according to claim 1, further comprising $MoO_3$, wherein the material comprises 100 weight parts of the phase and from more than 0 to 1 weight part of $MoO_3$.

16. The sintered bulk magnetic material for microwave according to claim 1, further comprising $WO_3$, wherein the material comprises 100 weight parts of the phase and from more than 0 to 1 weight part of $WO_3$.

17. The sintered bulk magnetic material for microwave according to claim 1, further comprising PbO, wherein the material comprises 100 weight parts of the phase and from more than 0 to 1 weight part of PbO.

18. The sintered bulk magnetic material for microwave according to claim 1, further comprising $B_2O_3$, wherein the material comprises 100 weight parts of the phase and from more than 0.05 to 2 weight part of $B_2O_3$.

19. The sintered bulk magnetic material for microwave according to claim 1, having a relative sintering density of 95.0 to 99.8%.

20. A component for a high-frequency circuit, comprising a sintered bulk magnetic material for microwave, said magnetic material comprising a phase having garnet structure, said phase comprising a component represented by Formula I $$(A_{3-a}Bi_a)B_xO_y \qquad \text{Formula I}$$

where A represents a component comprising at least one element selected from yttrium (Y) and rare earth elements, B represents a component comprising Fe, a represents a number in the range of 0 to less than 2.00, x represents a number in the range of 4.76 to less than 5.00, and y represents a number satisfying an inequality $1.5(3+x) \leq y \leq 12$, wherein a conductor is disposed in said magnetic material to form a closed magnetic patch.

21. The component for high-frequency circuit according to claim 20, which is a nonreciprocal circuit element for high frequency.

22. The component for high-frequency circuit according to claim 20, which is a high-frequency inductance element.

23. The component for high-frequency circuit according to claim 20, wherein said conductor comprises Ag in an amount of 60 wt % or more.

24. The component for high-frequency circuit according to claim 23, wherein said conductor comprises at least one component selected from the group consisting of Pd, Ag-Pd alloy and $RuO_2$ in an amount of less than 40 wt %.

* * * * *